(12) United States Patent
Xu et al.

(10) Patent No.: US 11,508,754 B2
(45) Date of Patent: Nov. 22, 2022

(54) SEMICONDUCTOR MEMORY STRUCTURE AND METHOD FOR FORMING THE SAME

(71) Applicant: TAIWAN SEMICONDUCTOR MANUFACTURING COMPANY LTD., Hsinchu (TW)

(72) Inventors: Nuo Xu, Milpitas, CA (US); Sai-Hooi Yeong, Hsinchu County (TW); Yu-Ming Lin, Hsinchu (TW); Zhiqiang Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 4 days.

(21) Appl. No.: 17/142,166

(22) Filed: Jan. 5, 2021

(65) Prior Publication Data
US 2022/0216223 A1     Jul. 7, 2022

(51) Int. Cl.
| | |
|---|---|
| *H01L 29/78* | (2006.01) |
| *H01L 29/66* | (2006.01) |
| *H01L 27/1159* | (2017.01) |
| *H01L 27/06* | (2006.01) |
| *G11C 11/22* | (2006.01) |
| *H01L 27/11585* | (2017.01) |
| *G11C 16/04* | (2006.01) |

(52) U.S. Cl.
CPC ........ *H01L 27/1159* (2013.01); *G11C 11/223* (2013.01); *G11C 16/0466* (2013.01); *G11C 16/0483* (2013.01); *H01L 27/0688* (2013.01); *H01L 27/11585* (2013.01); *H01L 29/6684* (2013.01); *H01L 29/78391* (2014.09)

(58) Field of Classification Search
CPC ......... H01L 27/11582; H01L 27/11556; H01L 27/11565; H01L 27/11597; H01L 27/1159; H01L 27/11578; H01L 45/1233; H01L 29/40111; H01L 29/6684; H01L 29/792; H01L 29/516; H01L 25/0657; H01L 27/11514
See application file for complete search history.

(56) References Cited

U.S. PATENT DOCUMENTS

| | | | |
|---|---|---|---|
| 2012/0104484 A1* | 5/2012 | Lee | H01L 45/1253 257/324 |
| 2014/0264548 A1* | 9/2014 | Lee | H01L 29/7889 257/324 |
| 2021/0175253 A1* | 6/2021 | Han | H01L 27/11587 |

* cited by examiner

*Primary Examiner* — Meiya Li
(74) *Attorney, Agent, or Firm* — WPAT Law; Anthony King

(57) ABSTRACT

A semiconductor memory structure includes a substrate, two doped regions in the substrate, a plurality of gate layers, a plurality of insulating layers, a column over the substrate, a charge-trapping layer, and a channel layer. The substrate includes dopants of a first conductivity type, and the two doped regions include dopants of a second conductivity type complementary to the first conductivity type. The gate layers and the insulating layers are alternately stacked over the substrate. The column penetrates the gate layers and the insulating layers, and includes an isolation structure, a source structure and a drain structure. at two sides of the isolation structure. The charge-trapping layer is at two sides of the column, and the channel layer is between the charge-trapping layer and the column. A bottom surface of the charge-trapping layer is in contact with the substrate and separated from the two doped regions.

20 Claims, 30 Drawing Sheets

SEMICONDUCTOR MEMORY STRUCTURE AND METHOD FOR FORMING THE SAME

BACKGROUND

Recently, great progress has been achieved in development of semiconductor memory devices. Due to continuously increasing requirements for memory devices with mass capacity, integration density of memory cells in a memory device keeps increasing. Scaling the memory cell size and realizing high-density memory are eagerly needed for various applications such as internet of things (IoT) and mechanism learning. As critical dimensions of devices in integrated circuits shrink to the limits of common memory cell technologies, designers have been looking to techniques for stacking multiple planes of memory cells to achieve greater storage capacity, and to achieve lower costs per bit. A three dimensional (3D) memory array architecture has been realized by stacking several cells in series vertically up on each cell which is located in two dimensional (2D) array matrix. There is a continuous demand to develop improved semiconductor memory structures for satisfying the above requirements.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
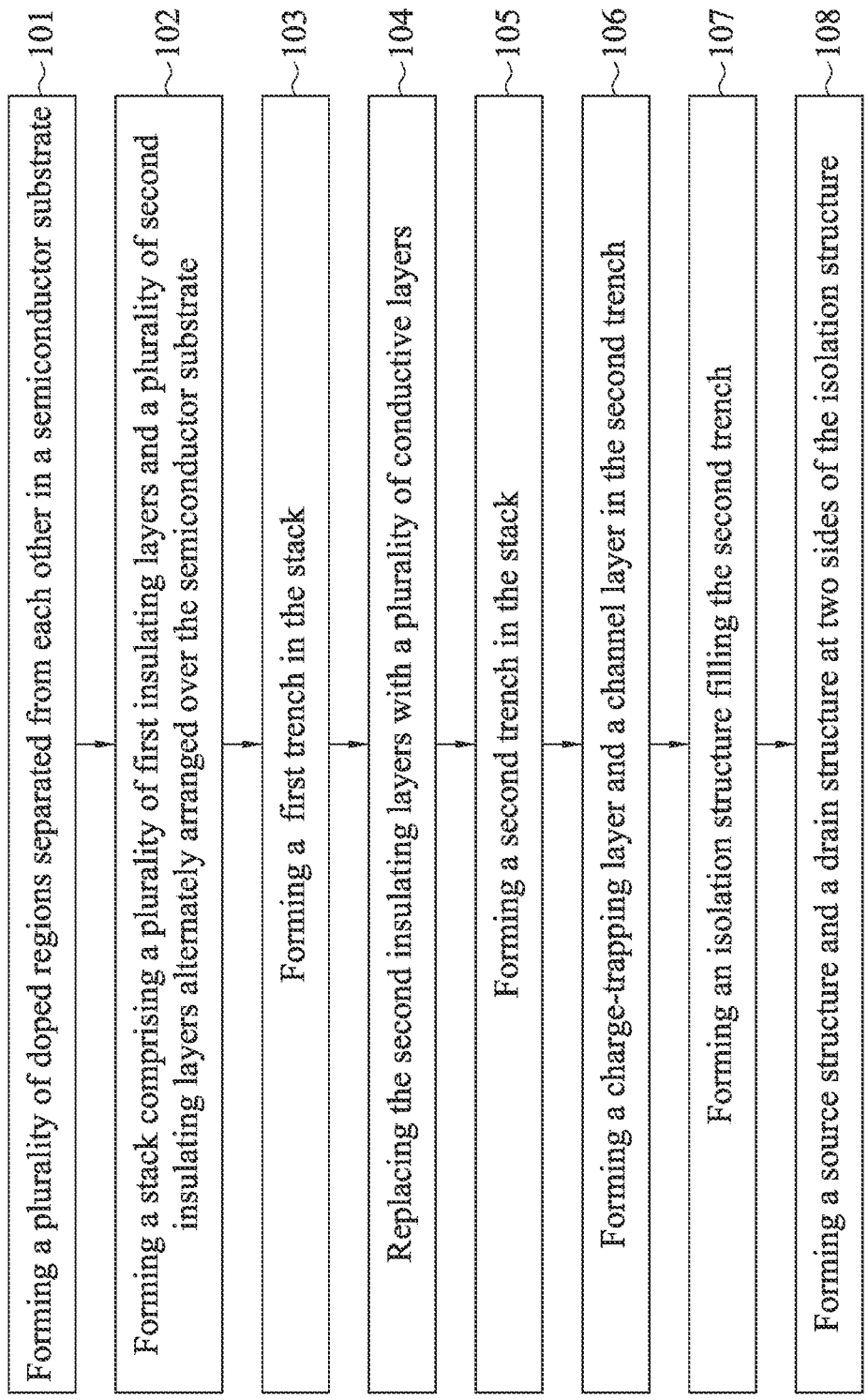
FIG. 1 is a flowchart of a method for forming a semiconductor memory structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Many modern day electronic devices contain electronic memory configured to store data. Electronic memory may be volatile memory or non-volatile memory. Volatile memory stores data when it is powered, while non-volatile memory (NVM) generally refers to any memory or storage that can retain stored data even when no power is applied. Example NVM includes flash memory, and flash memory includes two main types: NAND-type memory and NOR-type memory. The NAND-type memory has an advantage of a high-density structure including a number of storage transistors series-connected to form strings. However, reading and writing the content of any of the series-connected storage transistor requires activation of all series-connected storage transistors in one string, results in slow read/write access speed. Therefore, a memory structure complying with high-speed requirement in AI and high bandwidth memory, and high density requirements is needed. Existing 3D NAND-type memory bases on charge-trapping memory (CTM), which uses traps in insulating layers to store charge, instead of floating gates. Consequently, charge number needed for programming and erasing is reduced, resulting faster write speed and less write power consumption.

In some embodiments, a ferroelectric FET (FeFET), which provides a field-switching based storage instead of a charge-based storage, can be used in the 3D NAND-type memory. Further, FeFET is more scalable. The FeFET includes a ferroelectric layer, where dipoles, which are bonded, immobile "charges", are formed. The dipoles flip under electric field generated by potential difference, which refers to voltage drop across the channel and the gate stack. In some embodiments, positive voltage is applied on the gate of the FeFET for programming, and negative voltage is applied on the gate of the FeFET for erasing.

In some embodiments, when the FeFET includes a channel layer that including materials such as intrinsically strong N type material or intrinsically strong P type material, the FeFET has difficulty in erasing or programming. In other words, memory wind (MW) is decreased. In some comparative approaches, voltages for programming and erasing are increase to overcome the small MW issue. However, it raises reliability issue: The gate of Fe FET may breakdown in cycles fewer than expected.

The present disclosure therefore provides a semiconductor memory structure and a method for forming the same that is able to improve erasing operation efficiency and thus mitigate the small MW issue. In some embodiments, doped regions are formed in the substrate on which the 3D memory array is stacked. Accordingly, NPN junctions or PNP junctions are formed by the substrate and the doped region. The NPN junctions or PNP junctions are able to provide charge carriers (hereinafter referred to as carriers) into the channel layer. Further, the carriers are injected into the channel layer, and thus an inversion layer may be formed in the channel layer. In some embodiments, the inversion layer helps to screen electric field toward the channel layer. Therefore, the electric fields generated to flip dipoles can be concentrated in the ferroelectric layer. Thus erasing and programming operation efficiency can be improved.

FIG. 1 is a flowchart representing a method 10 for forming a semiconductor memory structure according to aspects of the present disclosure. In some embodiments, the method 10 includes a number of operations (101, 102, 103, 104, 105, 106, 107 and 108) and is further described below according to one or more embodiments. It should be noted that the operations of the method 10 may be omitted, rearranged, or otherwise modified within the scope of the various aspects. It should further be noted that additional operations may be provided before, during, and after the method 10, and that some other operations may just be briefly described herein.

Figure 2A:
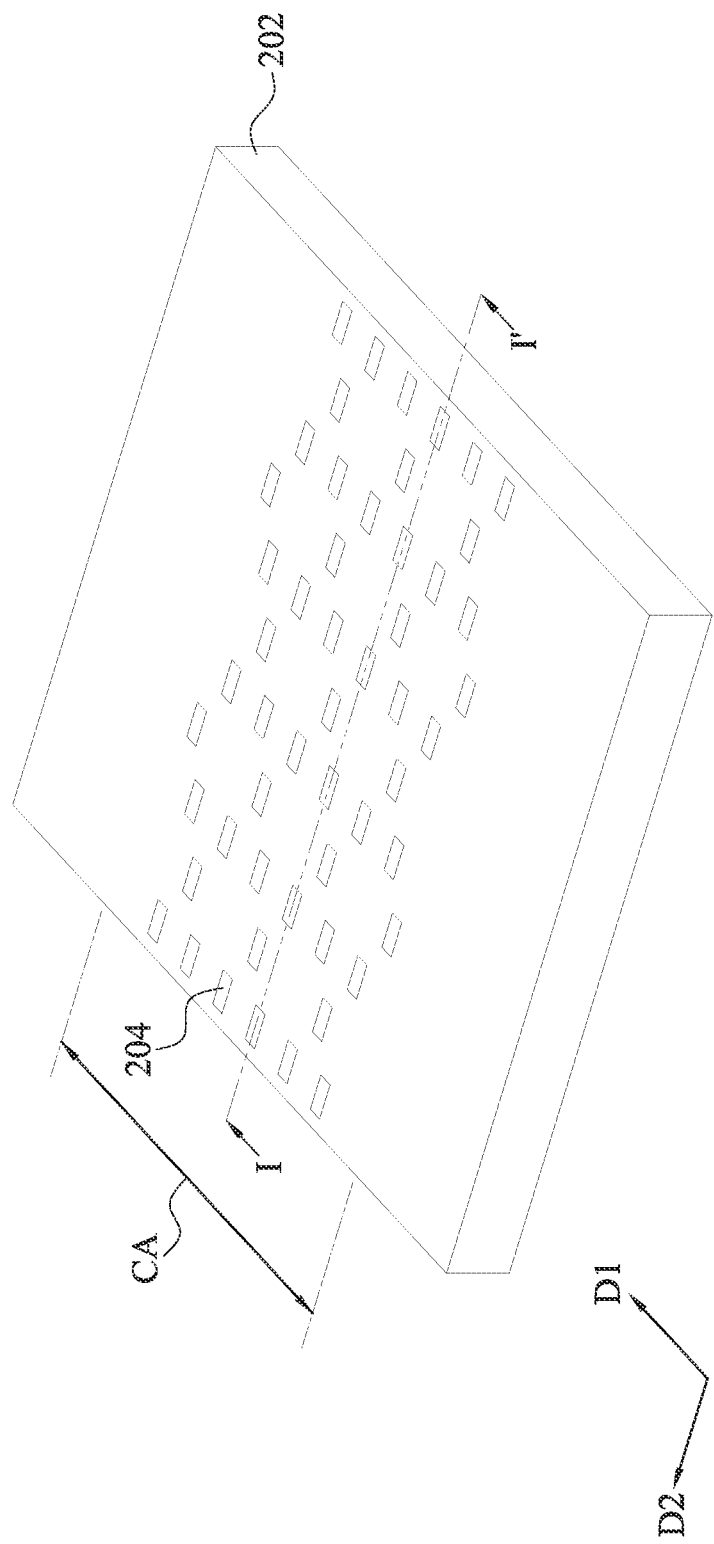
FIGS. 2A, 3A, 4A, 5A, 6A, 7A, 8A, 9A, 10A, 11A, 12A, 13A, and 14A are schematic views of a semiconductor memory structure at various stages in the method for forming a semiconductor memory structure according to aspects of one or more embodiments of the present disclosure.
Figure 2B:
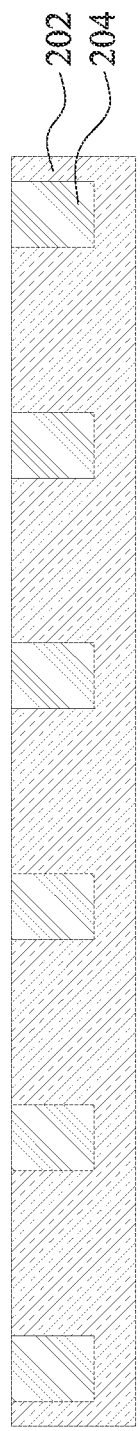
FIGS. 2B, 3B, 4B, 5B, 6B, 7B, 8B, 9B, 10B, 11B, 12B, 13B and 14B are schematic cross-sectional views taken along line I-I' of FIGS. of 2A, 3A, 4A, 5A, 6A, 7A, 8A, 9A, 10A, 11A, 12A, 13A, and 14A, respectively, according to aspects of one or more embodiments of the present disclosure.

Referring to FIG. 2A and FIG. 2B, in operation 101, the method 10 forms a plurality of doped regions 204 in a semiconductor substrate 202 (hereinafter referred to as substrate 202). In some embodiments, the substrate 202 is a silicon substrate. In some embodiments, the substrate 202 includes germanium, an alloy semiconductor (for example, SiGe), another suitable semiconductor material, or combinations thereof. In other embodiments, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods. In some embodiments, the substrate 202 can include various devices, such as CMOS devices, though not shown.

In some embodiments, the substrate 202 includes dopants of first conductivity type. For example, the substrate 202 may include p-type dopants such as boron, indium, another p-type dopant, or a combination thereof. Alternatively, the substrate 202 may include n-type dopants such as phosphorus, arsenic, another n-type dopant, or a combination thereof. In some embodiments, a concentration of the dopants of the first conductivity type in the substrate 202 may be between approximately $1E15$ ions/cm$^3$ and approximately $1E17$ ions/cm$^3$, but the disclosure is not limited thereto.

Still referring to FIGS. 2A and 2B, in some embodiments, the doped regions 204 may be formed in the substrate 202 by ion implantation and anneal. Each of the doped regions 204 includes dopants of a second conductivity type, which is complementary to the first conductivity type. For example, when the substrate 202 includes the p-type dopants, the doped regions 204 include the n-type dopants. Alternatively, when the substrate 202 includes the n-type dopants, the doped regions 204 include the p-type dopants. In some embodiments, a concentration of the dopants of the second conductivity type in the doped regions 204 is greater than the concentration of the dopants of the first conductivity type in the substrate 202. In some embodiments, the concentration of the dopants of the second conductivity type in each of the doped regions 204 is between approximately $1E18$ ions/cm$^3$ and approximately $1E20$ ions/cm$^3$, but the disclosure is not limited thereto.

As shown in FIGS. 2A and 2B, the doped regions 204 are formed in the substrate 202, and sidewalls and a bottom surface of each doped region 204 may be in contact with the substrate 202. In other words, the doped regions 204 can be referred to as island-like features separated from each other in the substrate 202. In some embodiments, the doped regions 204 are arranged in an array pattern. In some embodiments, the doped regions 204 are arranged in a staggered array pattern, as shown in FIG. 2A, but the disclosure is not limited thereto. In some embodiments, the doped regions 204 are formed in a cell array region CA where a memory cell array is to be formed, but the disclosure is not limited thereto.

Figure 3A:
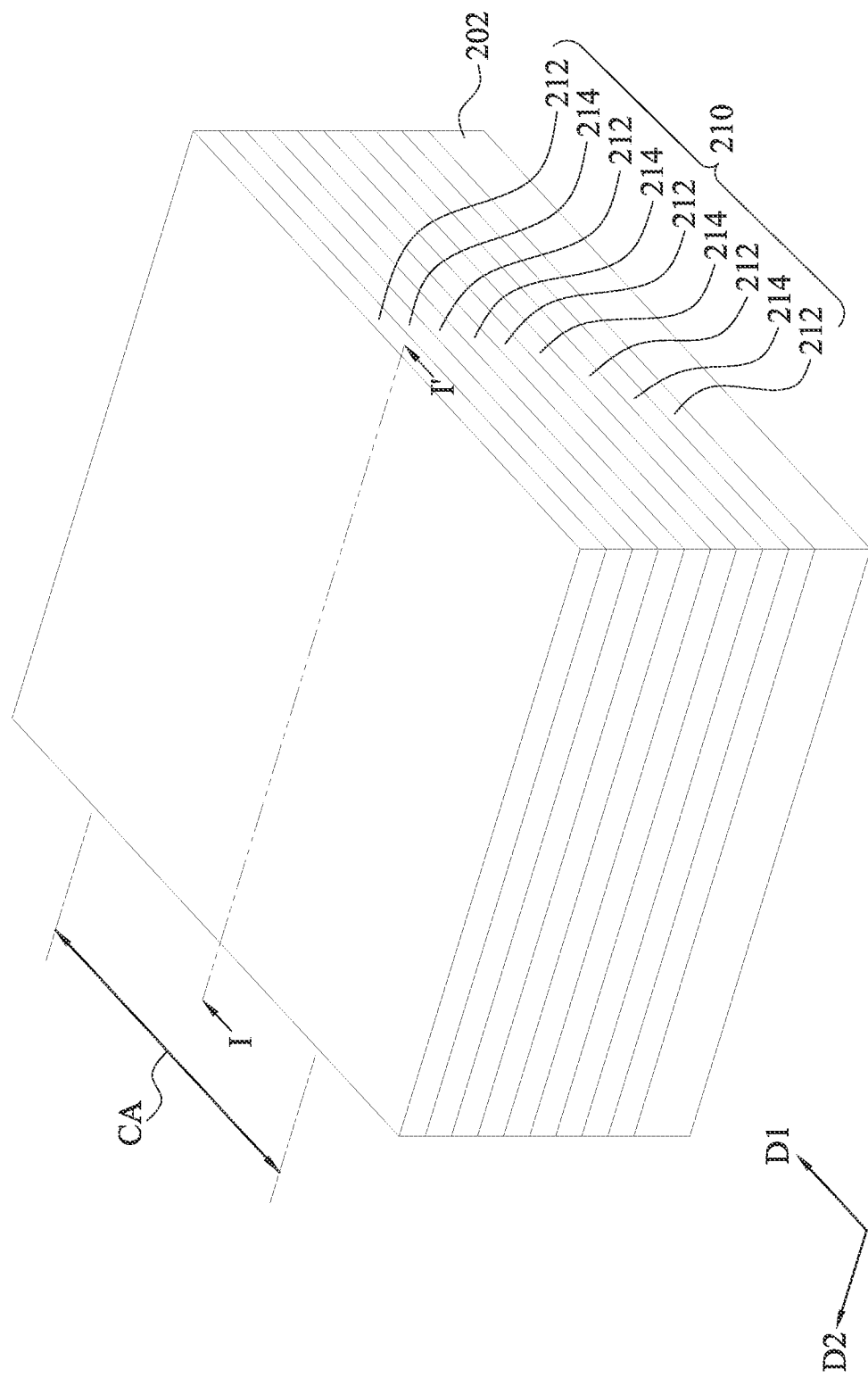
Figure 3B:
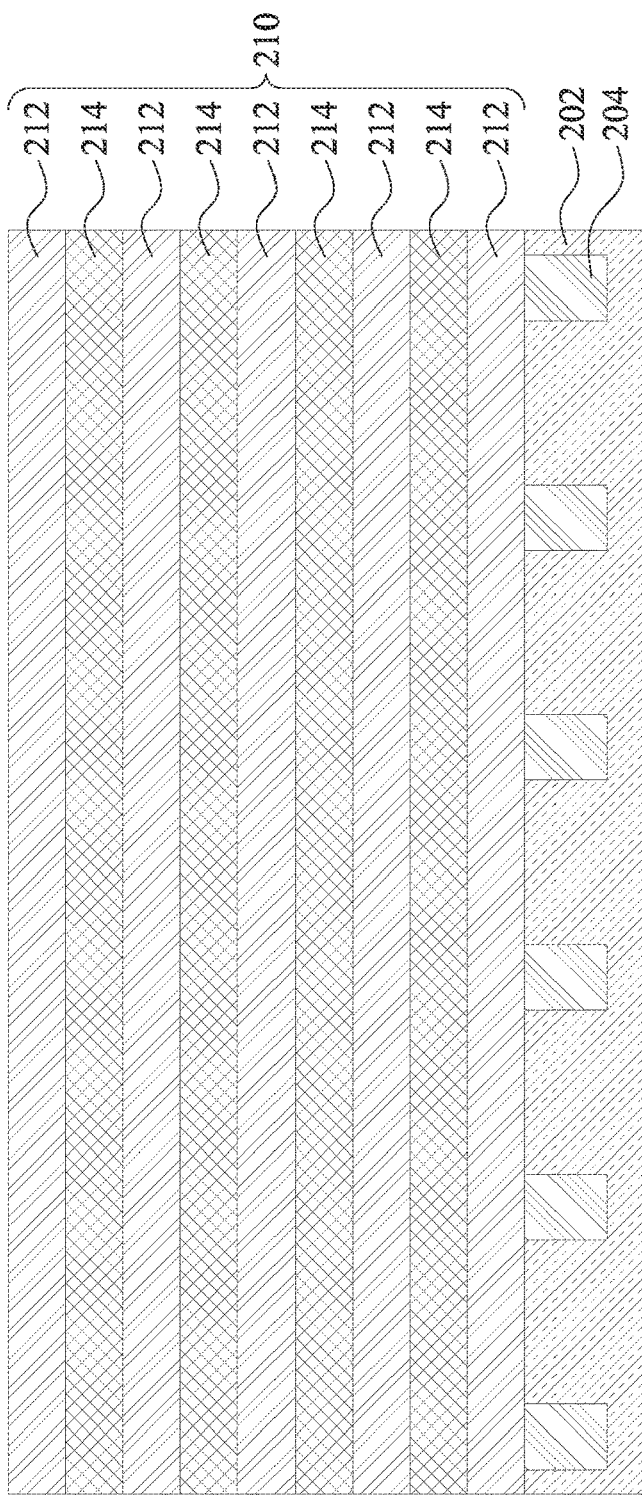

Referring to FIGS. 3A and 3B, in operation 102, the method 10 forms a stack 210 over the substrate 202. In some embodiments, the stack 210 includes a plurality of first insulating layers 212 and a plurality of second insulating layers 214. Further, the first insulating layers 212 and the second insulating layers 214 are alternately arranged. The number of the alternating layers 212 and 214 included in the stack 210 can be made as high as the number of layers needed for the semiconductor memory device. Further, in some embodiments, the topmost layer and the bottommost layer may both be the first insulating layers 212, as shown in FIGS. 3A and 3B, but the disclosure is not limited thereto. Thicknesses of the first insulating layers 212 and thicknesses of the second insulating layers 214 may be similar or different, depending on different product requirements. In some embodiments, the first insulating layers 212 and the second insulating layers 214 include different materials. Fox example, the first insulating layers 212 may include silicon oxide, and the second insulating layers 214 may include silicon nitride, but the disclosure is not limited thereto.

Figure 4A:
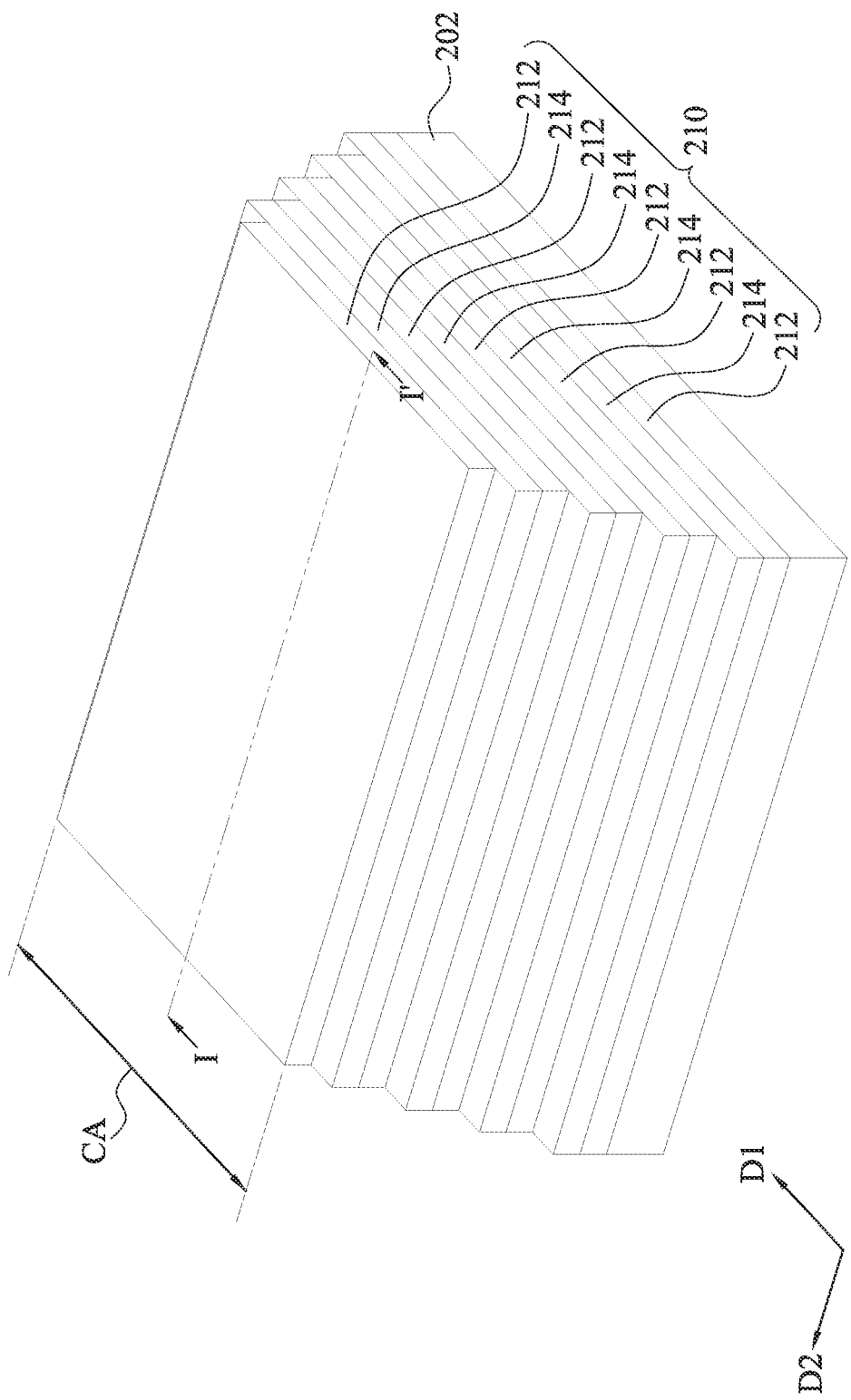
Figure 4B:
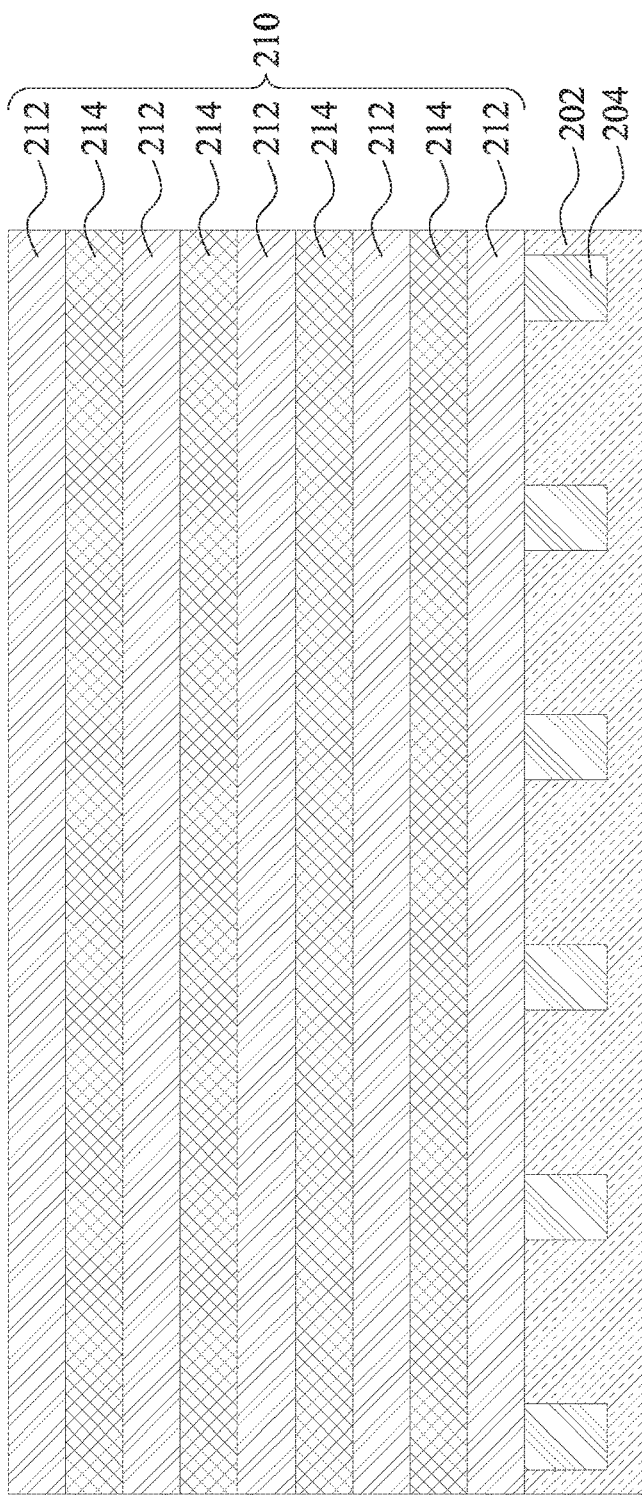

Referring to FIGS. 4A and 4B, portions of the first insulating layers 212 and portions of the second insulating layers 214 are removed, such that remaining first insulating layers 212 and remaining second insulating layers 214 over the substrate 202 form a staircase configuration. In some embodiments, portions of the second insulating layers 214 are exposed, and areas of the exposed second insulating layers 214 may be similar. In some embodiments, the remaining topmost first insulating layer 212 can be used to define a location and a dimension of a cell array region CA, which will be described below.

Figure 5A:
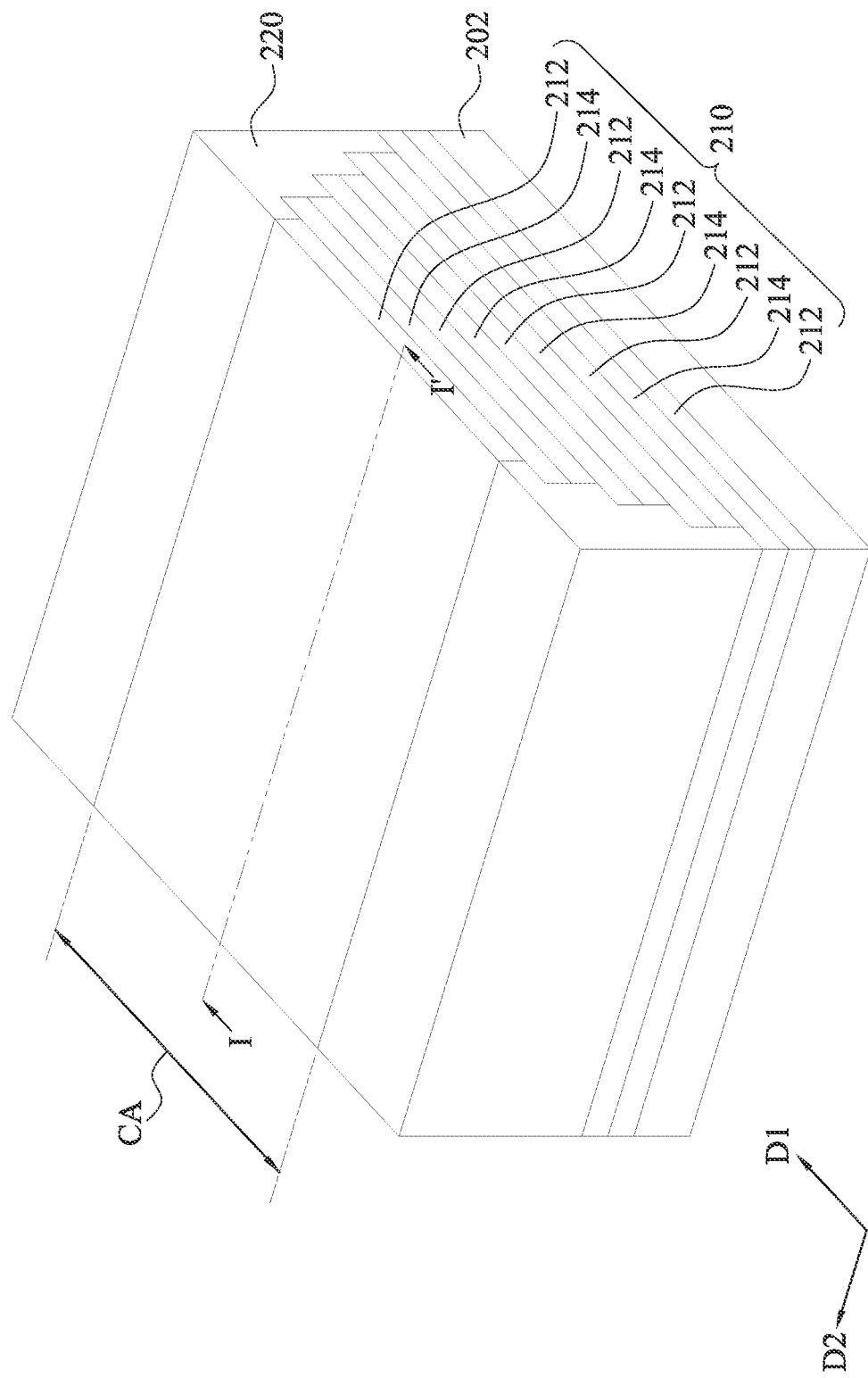
Figure 5B:
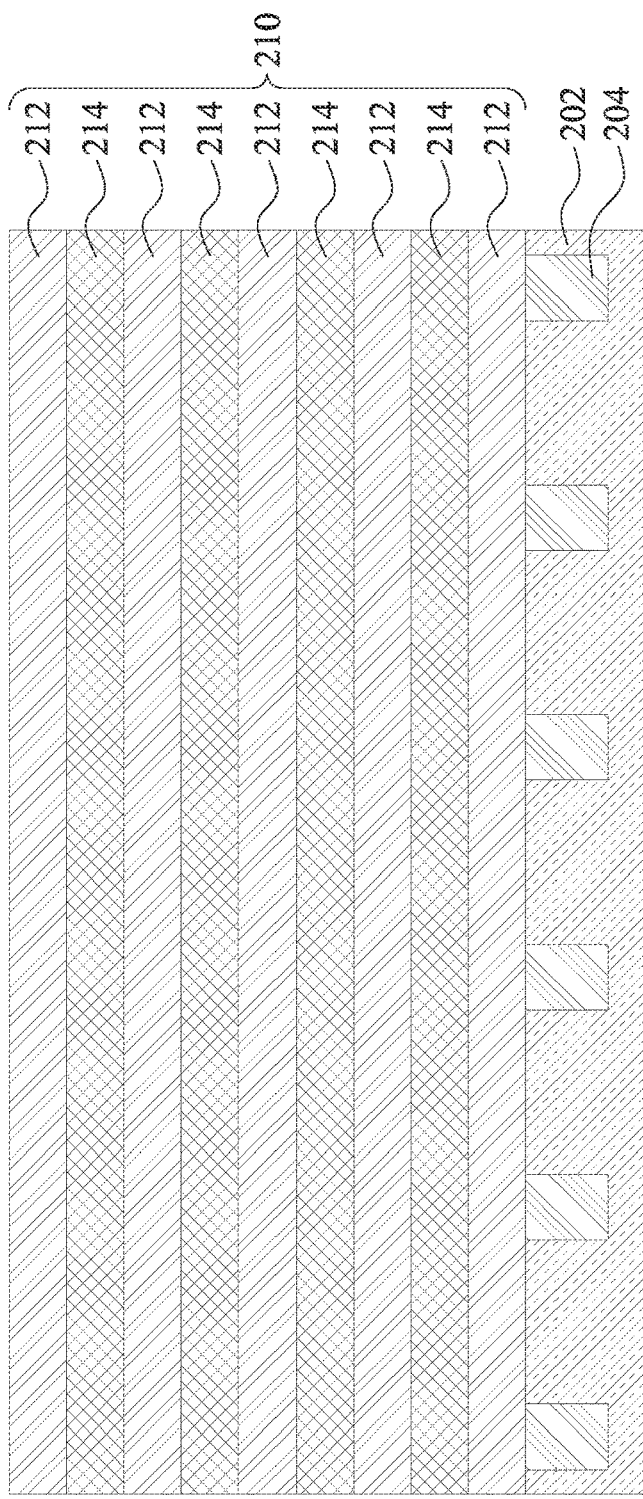

Referring to FIGS. 5A and 5B, in some embodiments, a dielectric structure 220 may be formed over the substrate 202. Further, a top surface of the dielectric structure 220 can be aligned with a top surface of the topmost first insulating layer 212, as shown in FIG. 5A. Consequently, an even and flush surface can be obtained.

Figure 6A:
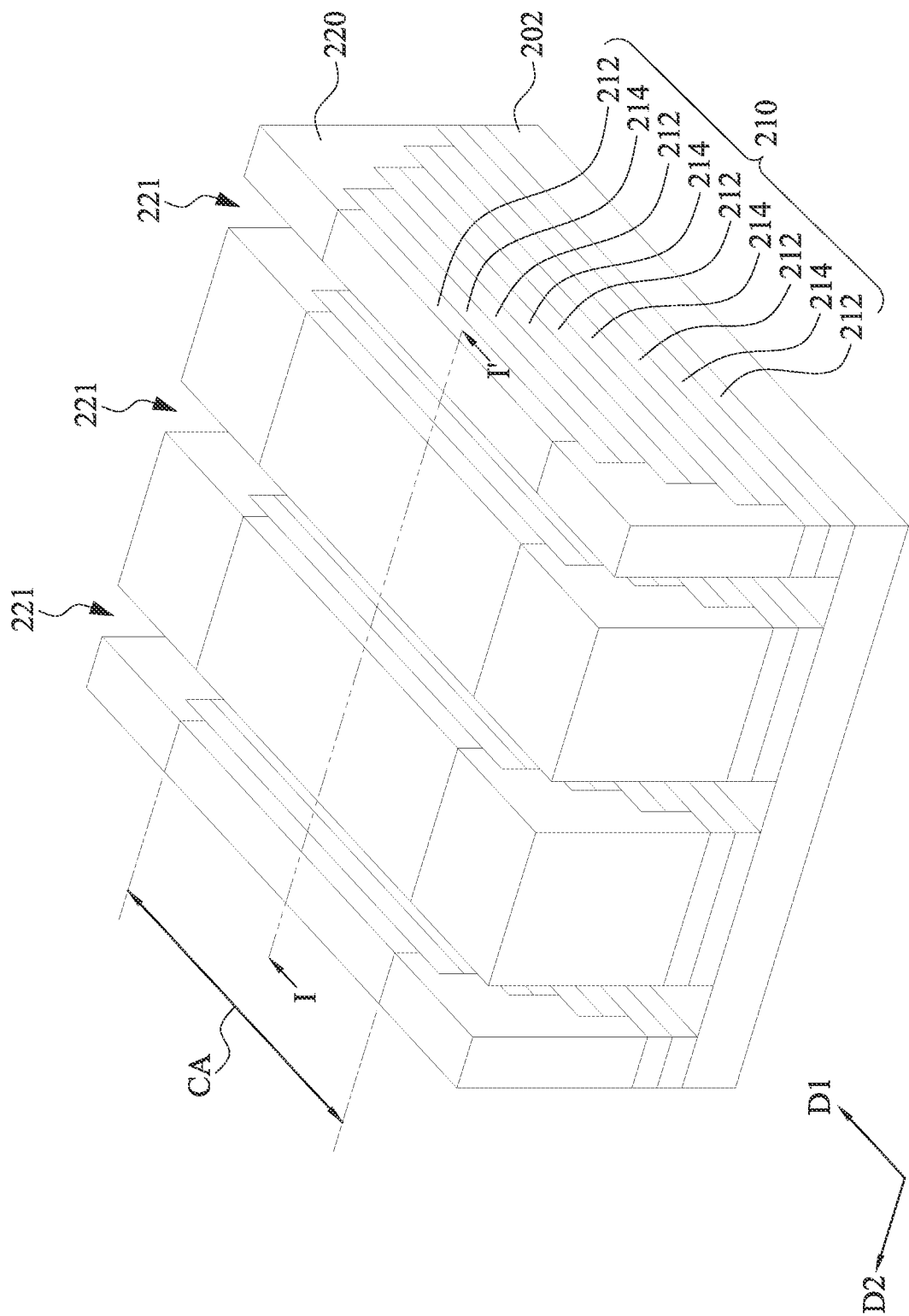
Figure 6B:
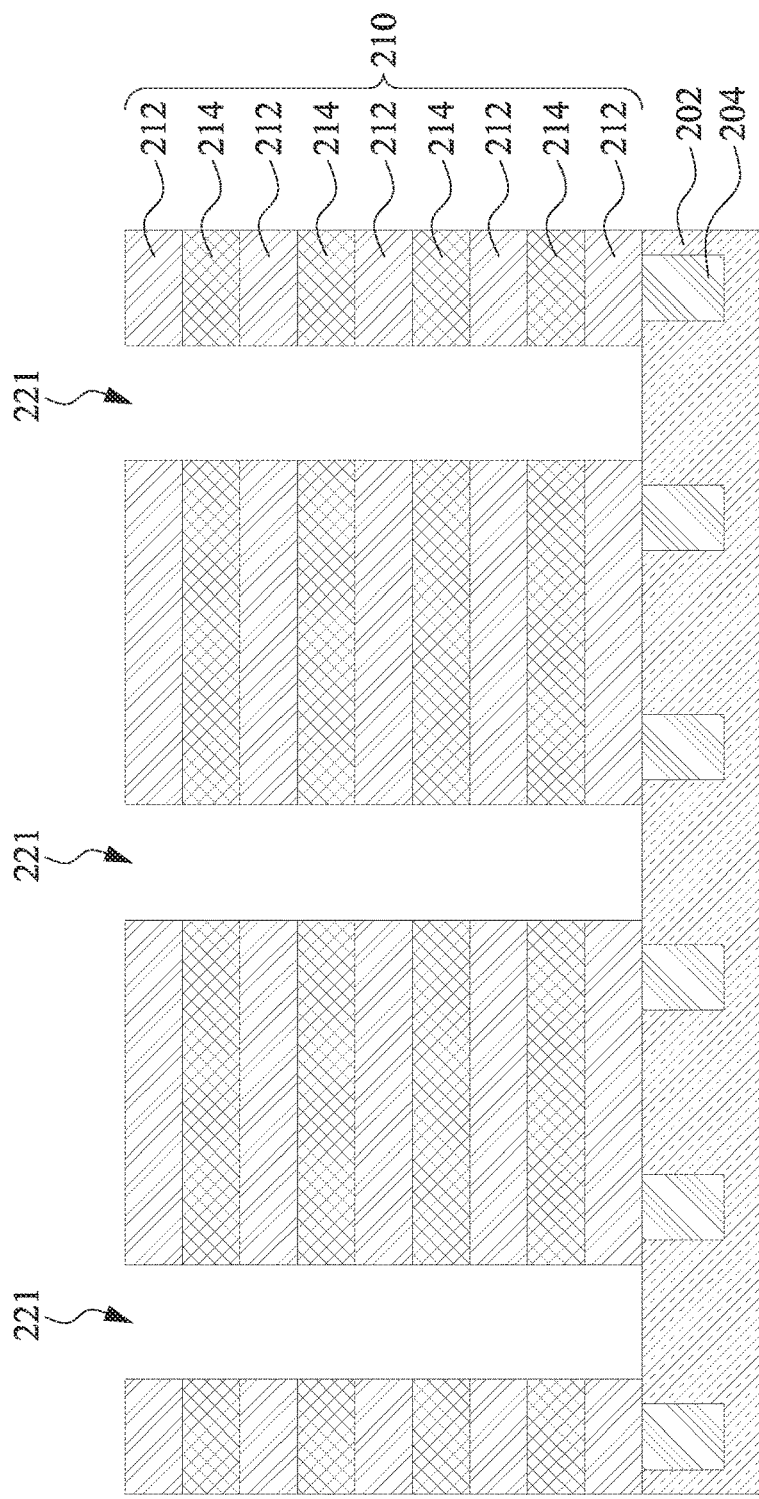

Referring to FIGS. 6A and 6B, in operation 103, the method 10 forms a trench 221 in the dielectric structure 220 and the stack 210. In some embodiments, the trench 221 extends along a first direction D1. In some embodiments, a plurality of trenches 221 may be formed in the dielectric structure 220 and the stack 210. As shown in FIG. 6A, the trenches 221 extend along the first direction D1, and are arranged along a second direction D2, which is different from the first direction D1. In some embodiments, the first direction D1 and the second direction D2 are perpendicular with each other. Each of the trenches 221 may penetrate the dielectric structure 220 and the stack 210 (i.e., the remaining first and second insulating layers 212 and 214 in the staircase configuration). Further, depths of the trenches 221 are similar with each other. In some embodiments, the trenches 221 are formed offset from the doped regions 204. Further, a width of the trenches 221 may be less than a distance between adjacent two doped regions 204. Thus, the substrate 202 may be exposed through a bottom of each trench 221, as shown in FIGS. 6A and 6B, but the disclosure is not limited thereto. In some embodiments, the first insulating layer layers 212 and the second insulating layers 214 may be exposed through two opposite sidewalls of each trench 221.

Figure 7A:
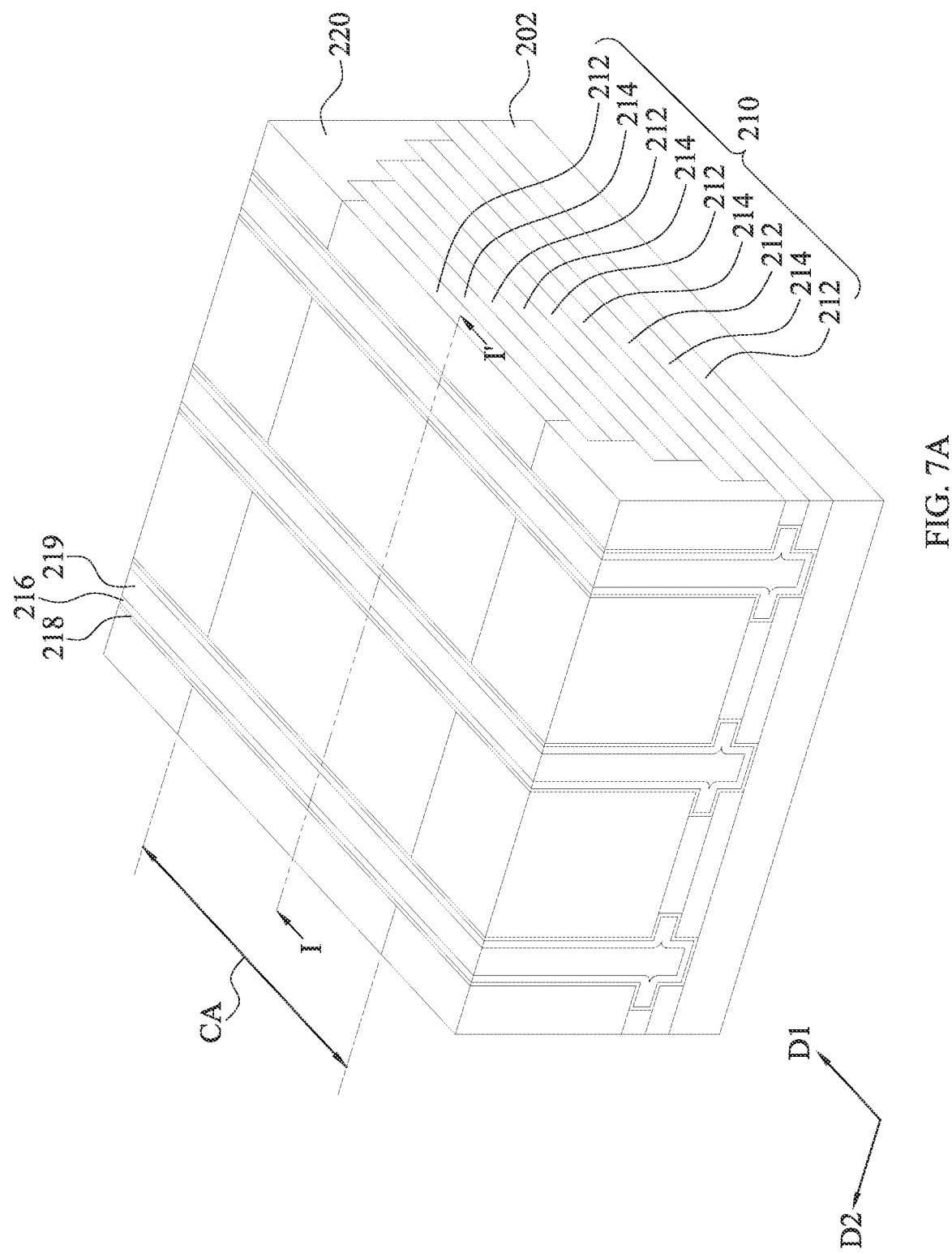
Figure 7B:
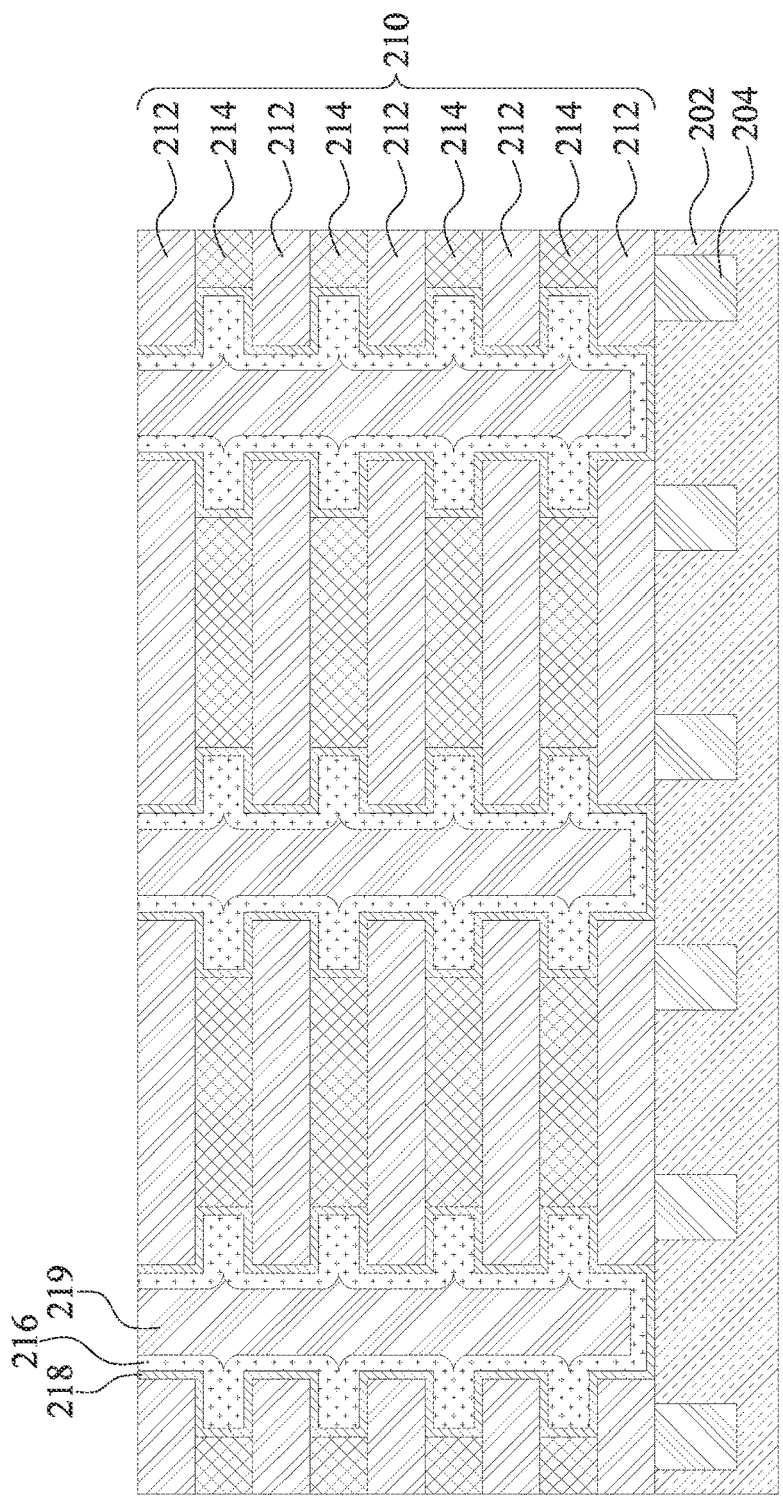

Referring to FIGS. 7A and 7B, in some embodiments, in operation 104, the method 10 replaces the second insulating layers 214 with a plurality of conductive layers 216. In some embodiments, portions of the second insulating layers 214 may be removed to form a plurality of recesses (not shown), which extend along the second direction D2 into the stack 210. In some embodiments, an etchant which has a higher selectivity for the second insulating layers 214 than the first insulating layers 212 may be introduced into the trenches 221. Accordingly, the portions of the second insulating layers 214 are removed to form the recesses between the first insulating layers 212, though not shown. A conductive material can be formed to fill the recesses and to form the conductive layer 216. In some embodiments, the conductive material may include, for example but not limited thereto, titanium nitride and tungsten (TiN/W), titanium nitride and copper (TiN/Cu), tantalum nitride and copper (TaN/Cu), cobalt and tungsten (Co/W), ruthenium (Ru), or other suitable conductive materials. In some embodiments, a barrier layer and/or an adhesive layer 218 may be formed prior to the forming of the conductive material, as shown in FIGS. 7A and 7B, but the disclosure is not limited thereto. In some embodiments, the conductive layer 216 may fill each of the recesses and cover sidewalls of each trench 221, as shown in FIG. 7B. Further, after the forming of the conductive layers 216, a sacrificial layer 219 may be formed to fill the trenches 221. The sacrificial layer 219 may include insulating materials different from the second insulating layers 214, but the disclosure is not limited thereto. In some embodiments, a planarization operation such as a chemical-mechanical polishing (CMP) operation can be performed to remove superfluous barrier layer 218, conductive layers 216 and sacrificial layer 219. Consequently, a top surface of the conductive layers 216, a top surface of the sacrificial layer 219 and a top surface of the topmost first insulating layer 212 are aligned with each other (i.e., substantially co-planar), as shown in FIG. 7B.

Figure 8A:
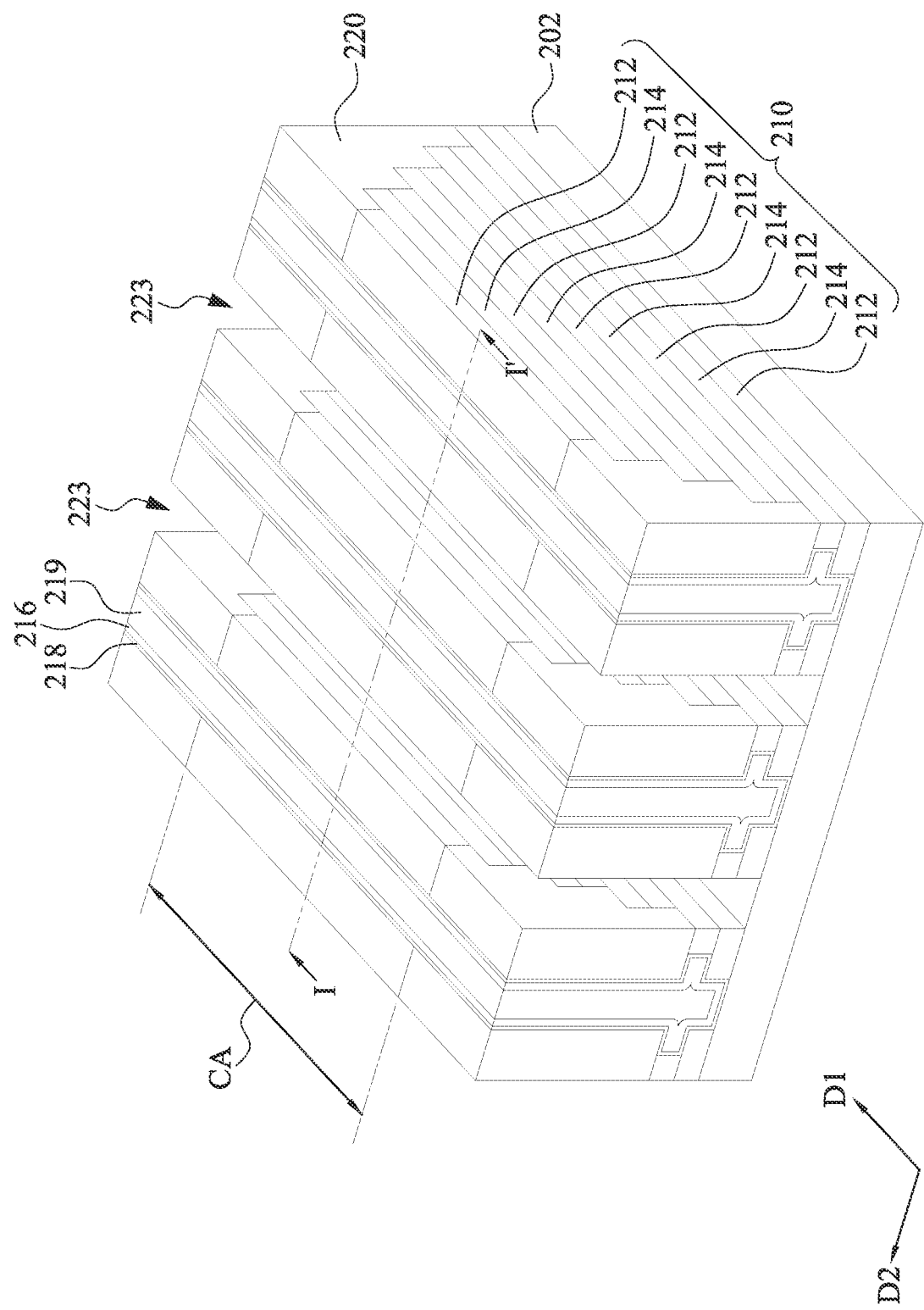
Figure 8B:
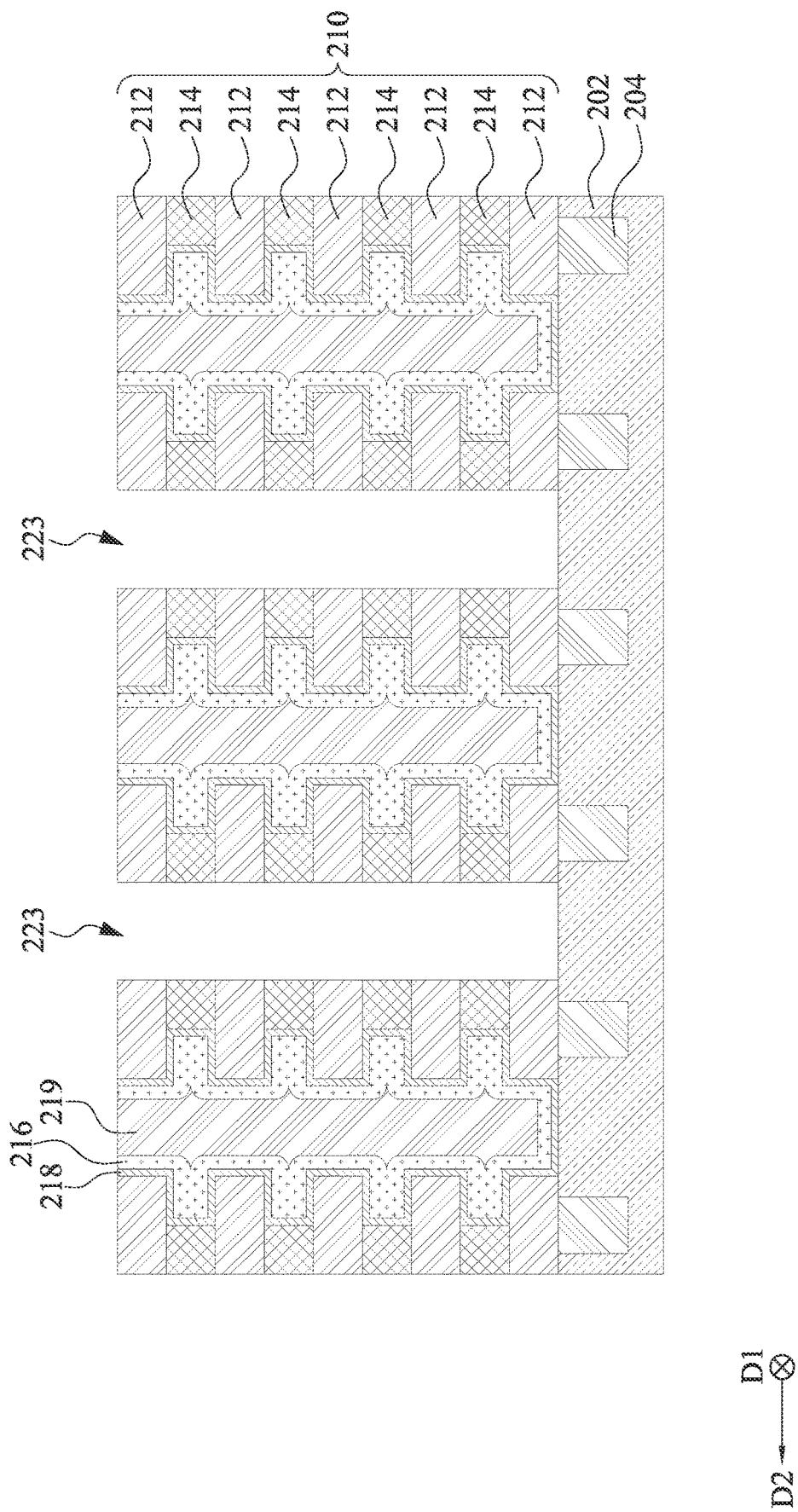

Referring to FIGS. 8A, 8B, 9A and 9B, in some embodiments, the operations 103 and 104 can be repeatedly performed to replace the second insulating layers 214 with the conductive layers 216, which may serve as gate layers for the semiconductor memory structure to be formed. For example, a plurality of trenches 223 may be formed in the dielectric structure 220 and the stack 210. As shown in FIG. 8A, the trenches 223 extend along the first direction D1, and are arranged along the second direction D2. Further, depths of the trenches 223 are similar with each other. Similar to the trenches 221, each of the trenches 223 may penetrate the dielectric structure 220 and the stack 210 (i.e., the remaining first and second insulating layers 212 and 214 in staircase configuration). Further, dimensions of the trenches 223 are similar to that of the trenches 221. It should be noted that the trenches 223 and the trenches 221 (now filled with the barrier layer 218, the conductive layer 216 and the sacrificial layer 219) are alternately arranged. In some embodiments, the trenches 223 are formed offset from the doped regions 204. Further, a width of the trenches 223 may be less than the distance between adjacent two doped regions 204. Thus, the substrate 202 may be exposed through a bottom of each trench 223, as shown in FIGS. 8A and 8B, but the disclosure is not limited thereto. In some embodiments, the first insulating layer layers 212 and the second insulating layers 214 may be exposed through two opposite sidewalls of each trench 223.

Figure 9A:
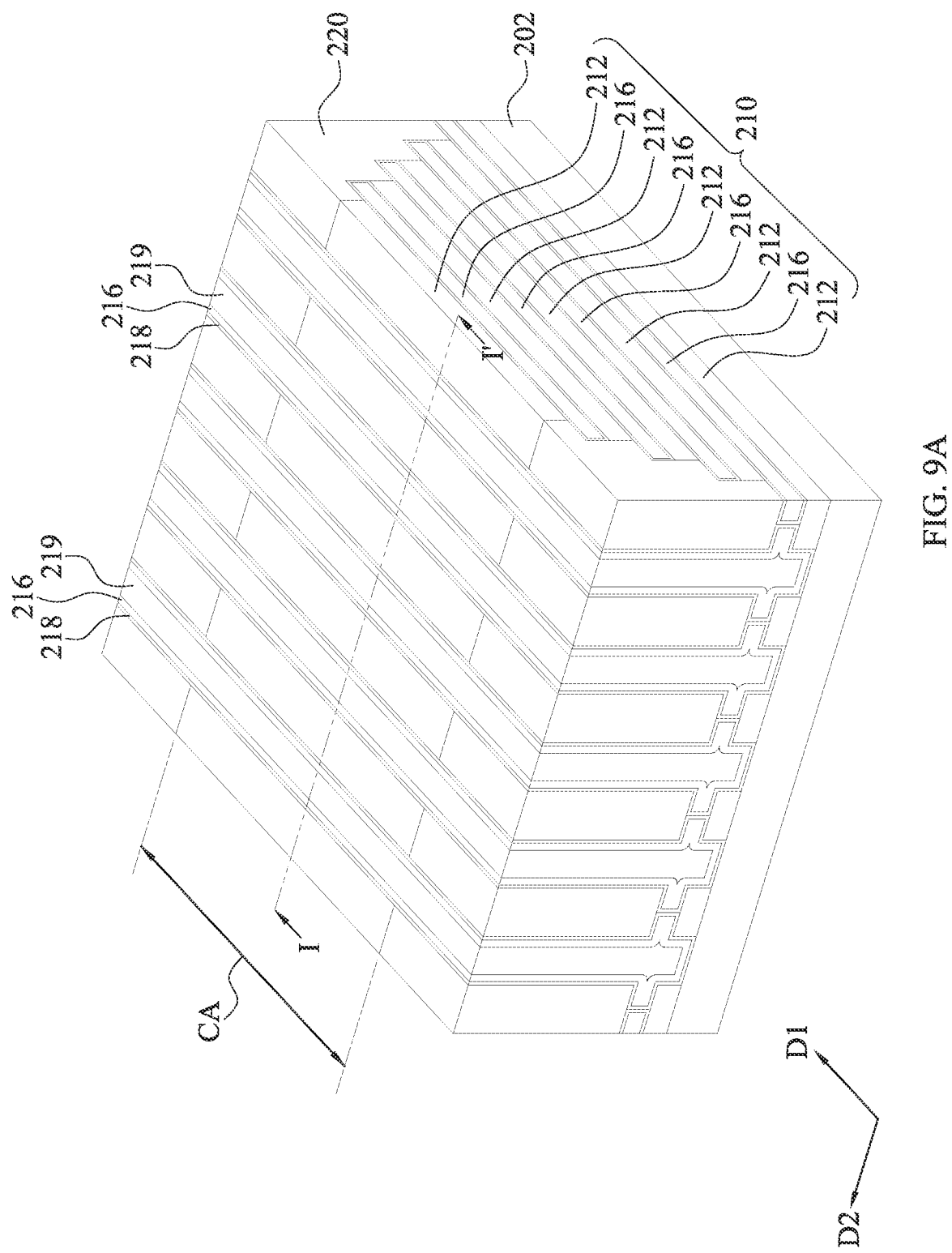
Figure 9B:
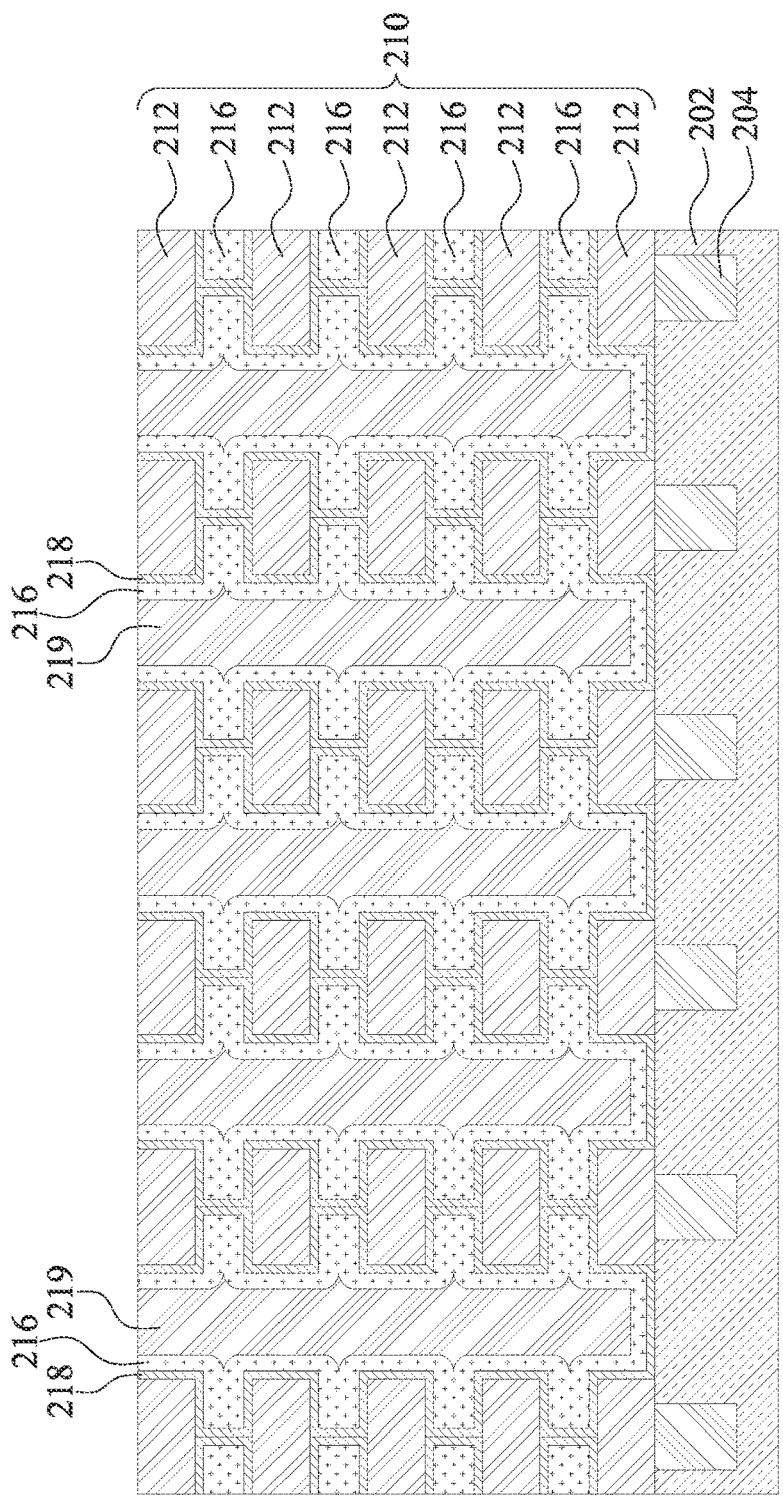
Figure 9B:

Referring to FIGS. 9A and 9B, in some embodiments, in operation 104, the method 10 replaces the second insulating layers 214, which are exposed through sidewalls of the trenches 223, with a plurality of conductive layers 216. As mentioned above, portions of the second insulating layers 214 may be removed to form a plurality of recesses (not shown), which extend along the second direction D2 into the stack 210. In some embodiments, an etchant which has a higher selectivity for the second insulating layers 214 than the first insulating layers 212 can be introduced into the first trenches 212. Accordingly, the portions of the second insulating layers 214 are removed to form the recesses between the first insulating layers 212, though not shown. The conductive material may be formed to fill the recesses and to form the conductive layer 216. In some embodiments, a barrier layer and/or an adhesive layer 218 may be formed prior to the forming of the conductive material, as shown in FIGS. 9A and 9B, but the disclosure is not limited thereto. In some embodiments, the conductive layer 216 may fill each of the recesses and cover sidewalls of each trench 223, as shown in FIG. 9B. Further, after the forming of the conductive layers 216, a sacrificial layer 219 may be formed to fill the trenches 223. In some embodiments, a planarization operation such as a CMP operation may be performed to remove superfluous barrier layer 218, conductive layers 216 and sacrificial layer 219. Consequently, a top surface of the conductive layers 216, a top surface of the sacrificial layer 219 and a top surface of topmost the first insulating layer 212 are aligned with each other (i.e., substantially co-planar), as shown in FIG. 9B.

Figure 10A:
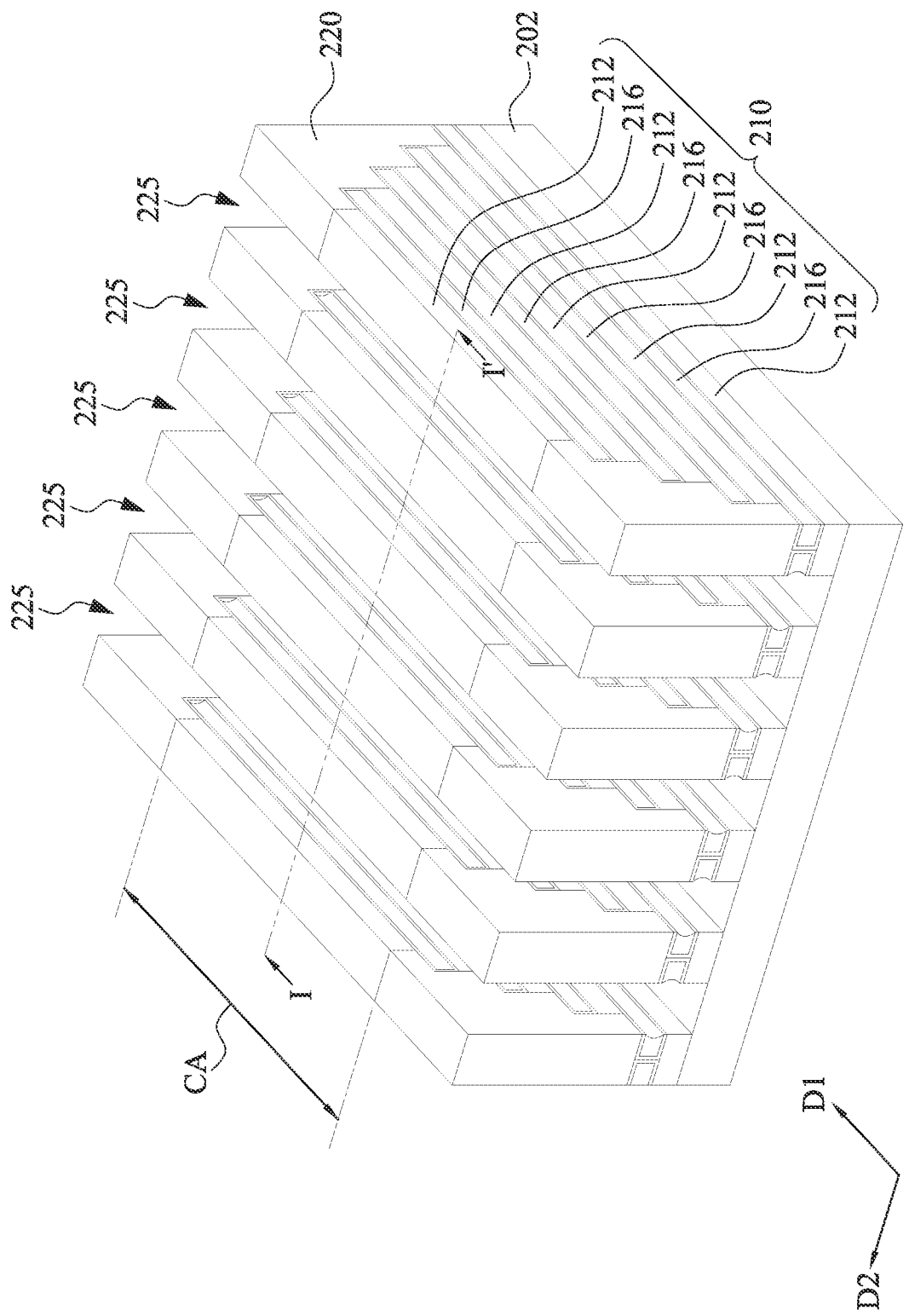
Figure 10B:
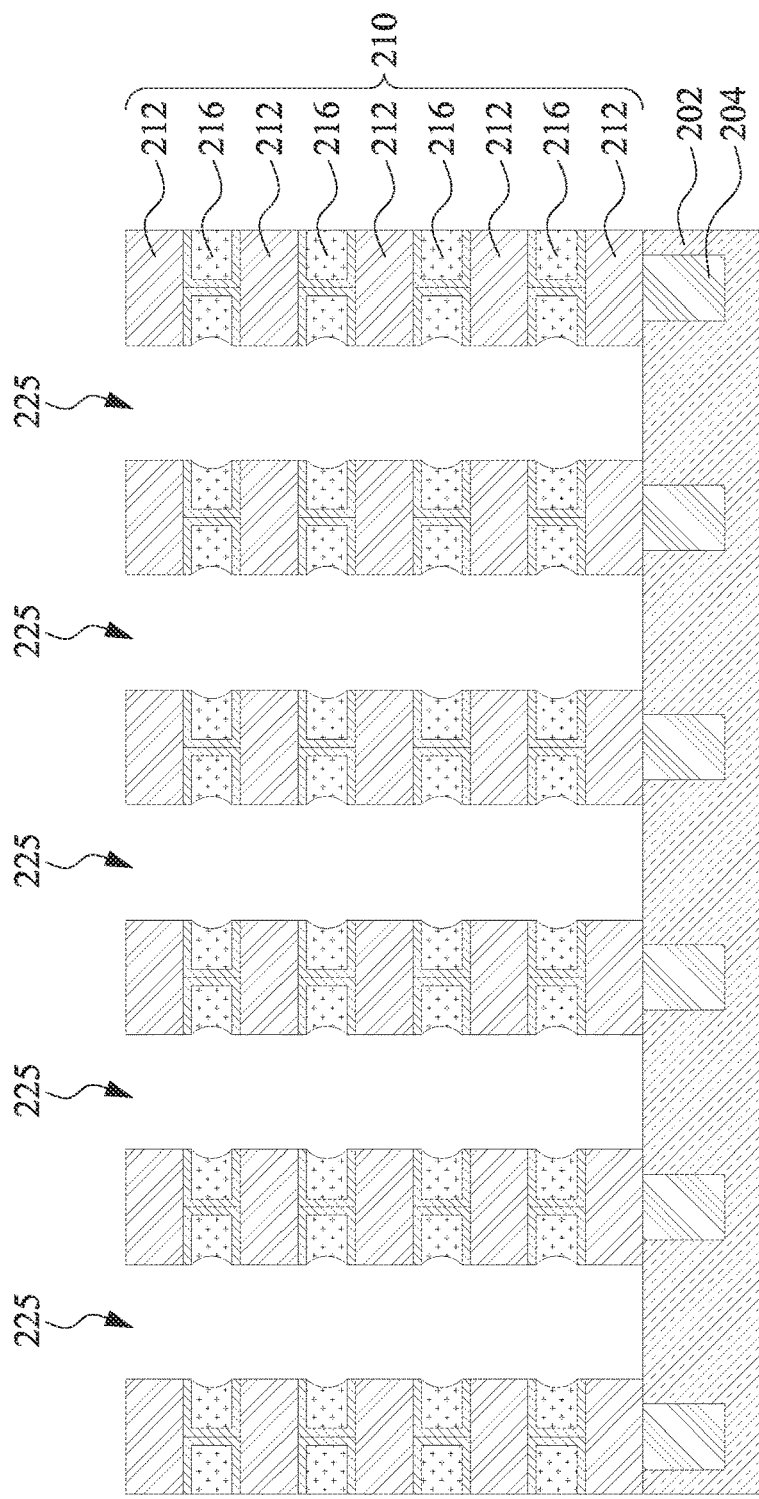

Referring to FIGS. 10A and 10B, in operation 105, the method 10 forms another trench 225. In some embodiments, a plurality of trenches 225 can be formed, the trenches 225 can extend along the first direction D1 and arranged along the second direction D2, but the disclosure is not limited thereto. In some embodiments, the sacrificial layer 219 and portions of the conductive layers 216 may be removed to form the trenches 225. For example, the sacrificial layer 219 may be entirely removed, and portions of the conductive layers 216 are removed to expose the substrate 202 through bottoms of the trenches 225, as shown in FIGS. 10A and 10B, but the disclosure is not limited thereto. Further, depths of the trenches 225 are similar with each other. In some embodiments, the trenches 225 are formed offset from the doped regions 204. Further, a width of the trenches 225 may be less than a distance between two adjacent doped regions 204. In some embodiments, remaining conductive layers 216 may be exposed through sidewalls of the trenches 225.

Figure 11A:
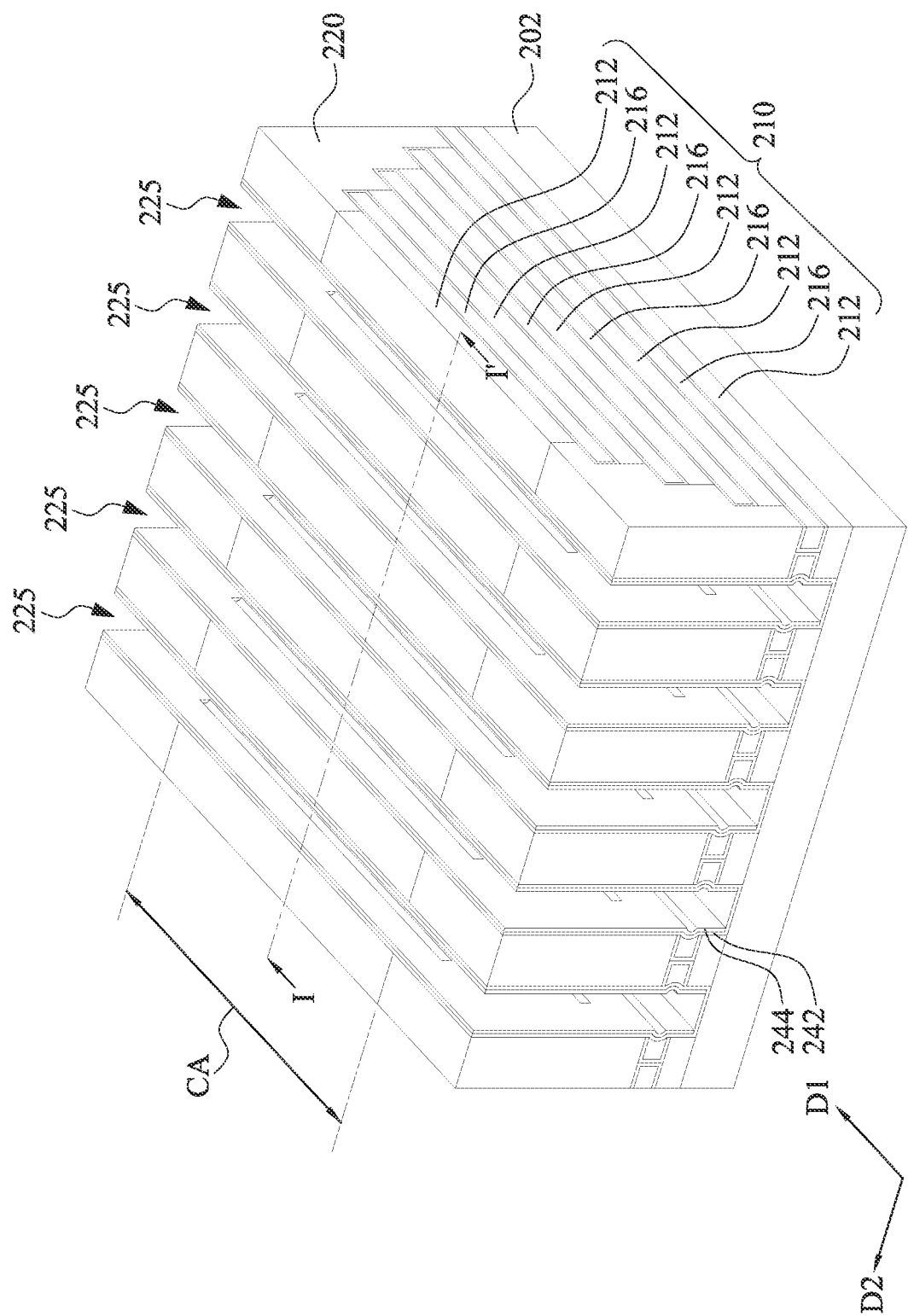
Figure 11B:
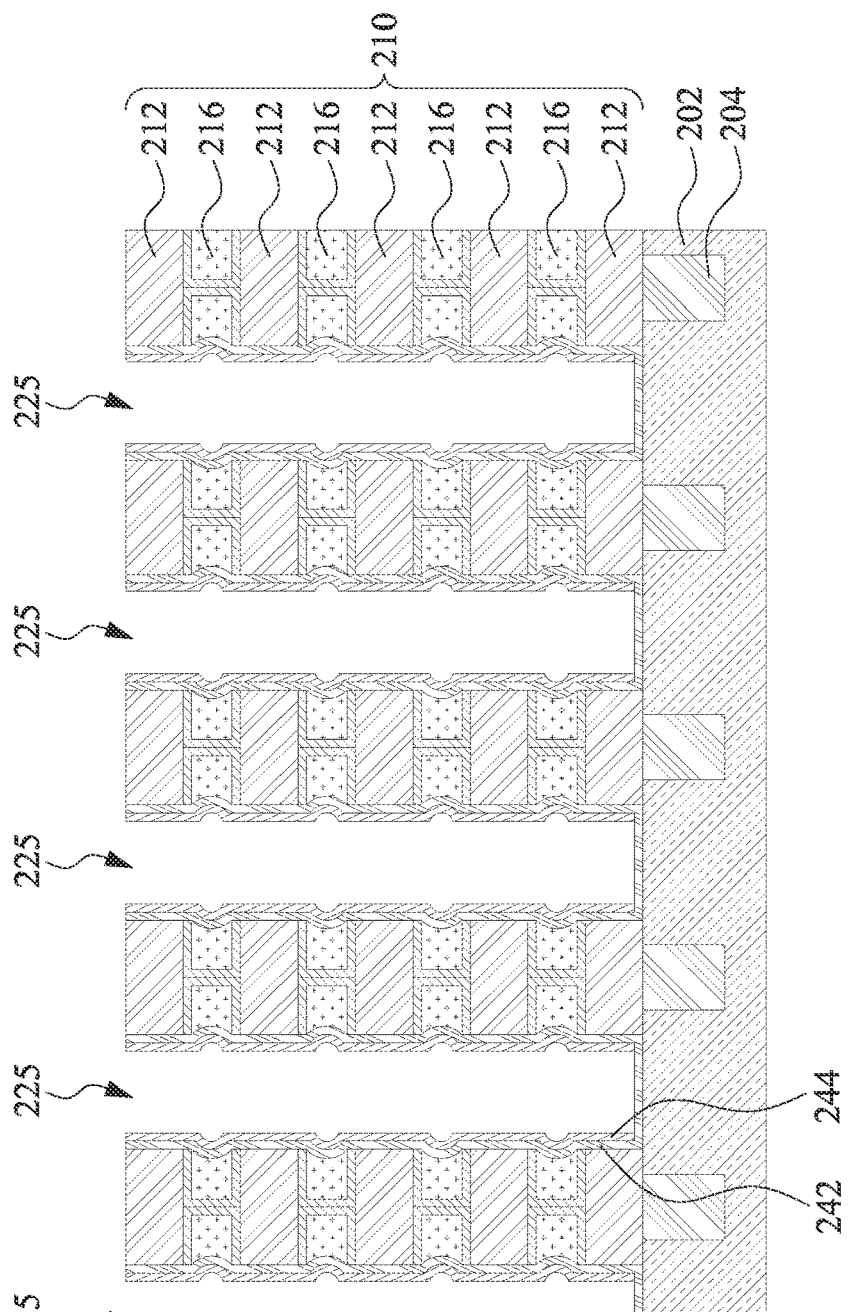

Referring to FIGS. 11A and 11B, in operation 106, the method 10 forms a charge-trapping layer 242 and a channel layer 244 in each trench 225. In some embodiments, the charge-trapping layer 242 can be referred to as a memory layer. The charge-trapping layer 242 may be conformally formed in each trench 225 by, for example but not limited thereto, a deposition. Therefore, the charge-trapping layer 242 covers the sidewalls and the bottom of each trench 225. Further, a bottom surface of the charge-trapping layer 242 is in contact with the substrate 202 but separated from the doped regions 204. In some embodiments, the charge-trapping layer 242 includes ferroelectric material, such as hafnium silicates (HfSiO), hafnium zirconium oxide (HfZrO, also referred to as HZO), and the like.

Still referring to FIGS. 11A and 11B, in some embodiments, the channel layer 244 is formed on the charge-trapping layer 242. In some embodiments, portions of the channel layer 244 may be removed from each of the trenches 225. In some embodiments, an etching back operation may be performed to remove the portions of the channel layer 244 from the bottom of the trenches 225 and from the topmost surface of the stack 210. Accordingly, the remaining channel layer 224 exposes the charge-trapping layer 242 over the bottoms of the trenches 225 but covers the charge-trapping layer 242 over the sidewalls of the trenches 225. Additionally, the channel layer 244 is separated from the substrate 202 by the charge-trapping layer 242. In some embodiments, the channel layer 244 may include semiconductor materials.

Figure 12A:
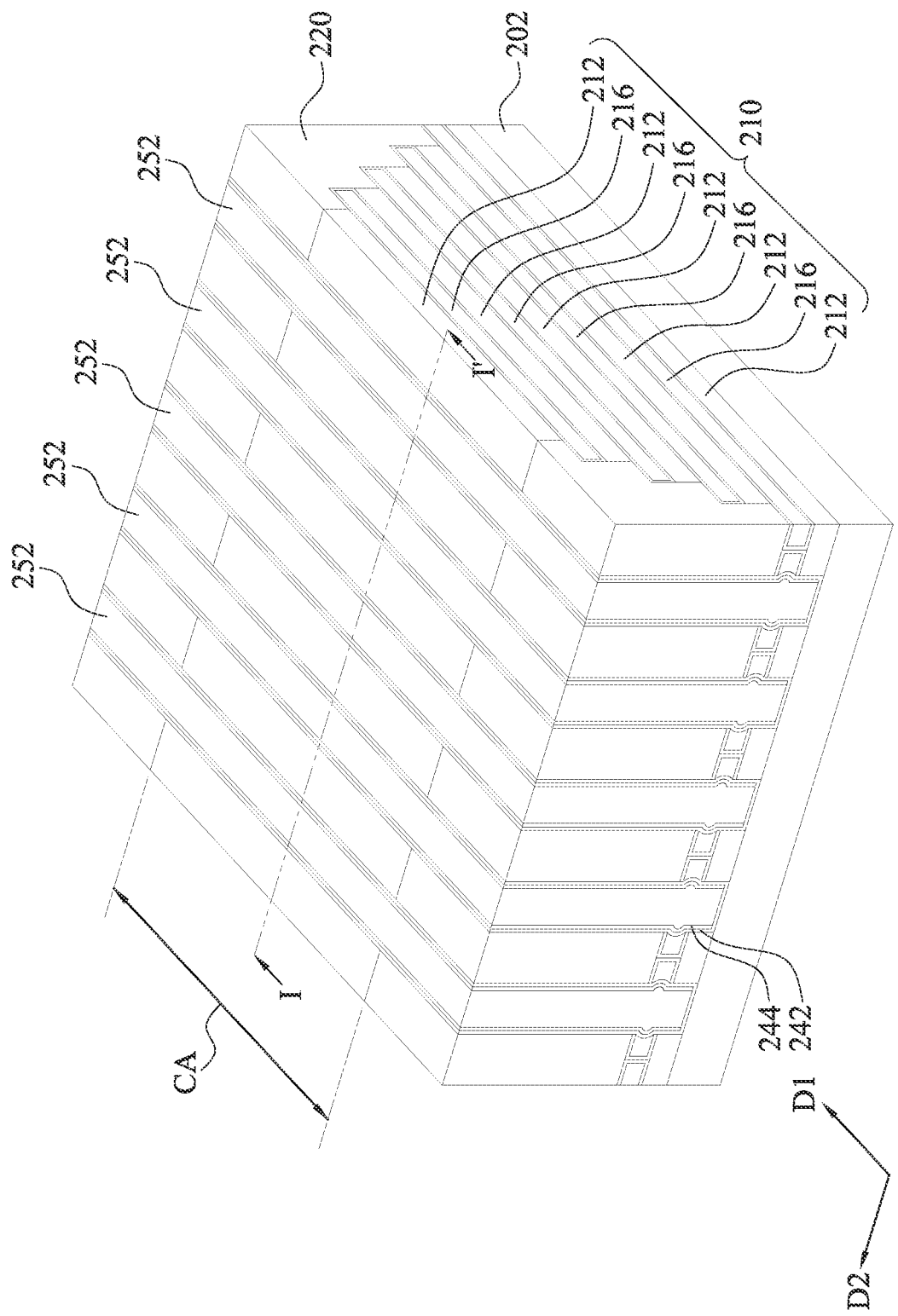
Figure 12B:
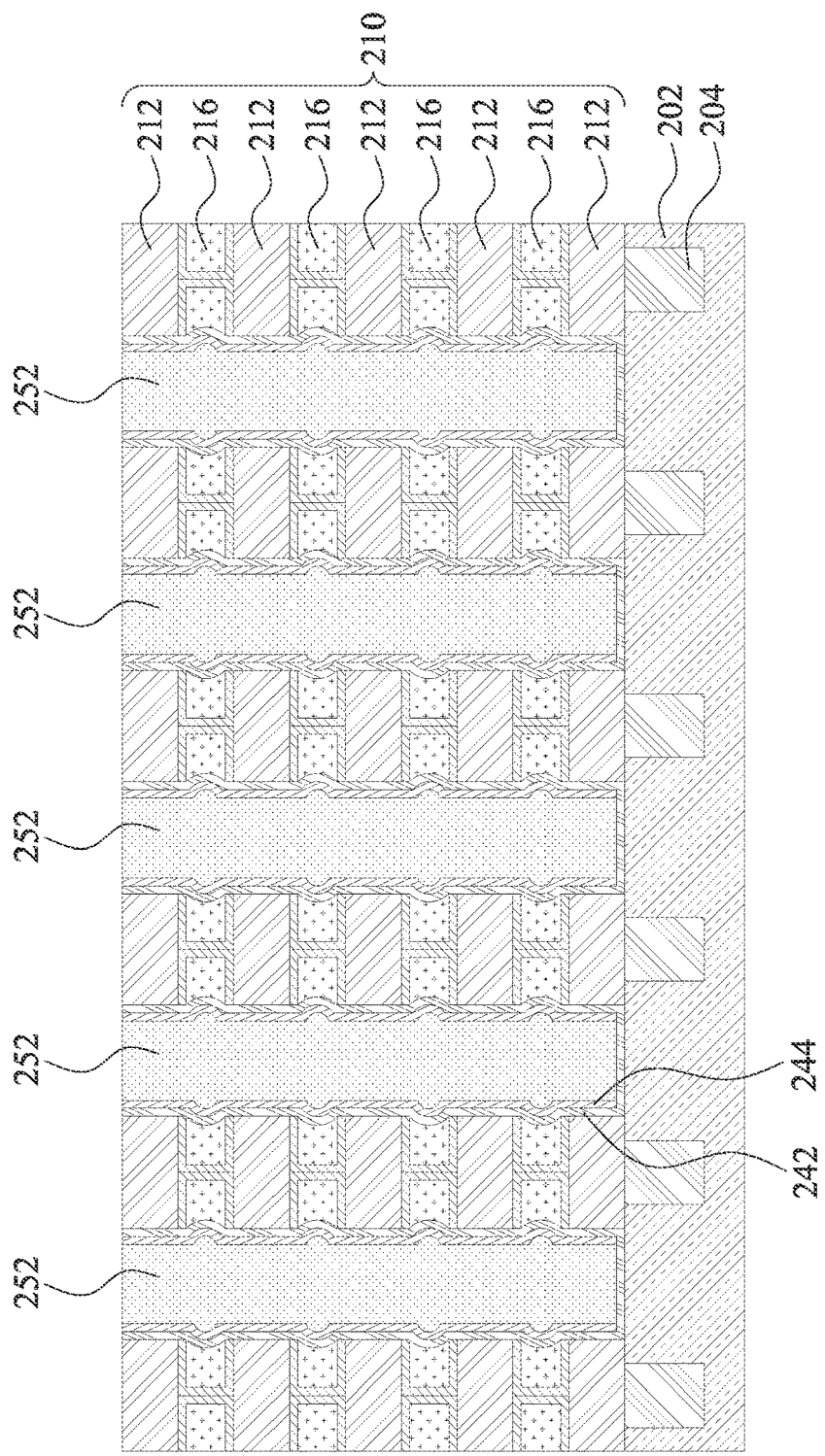
Figure 13A:
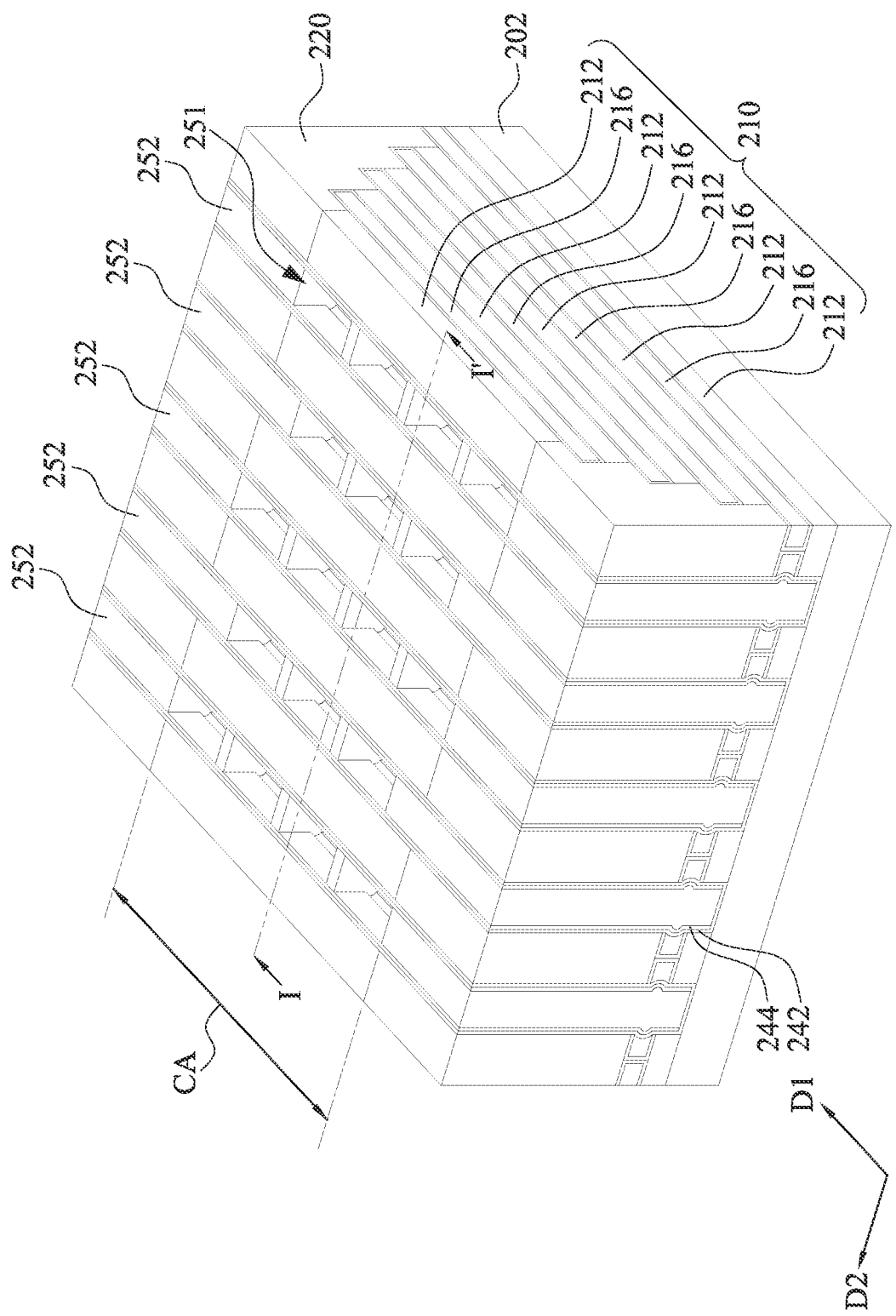
Figure 13B:
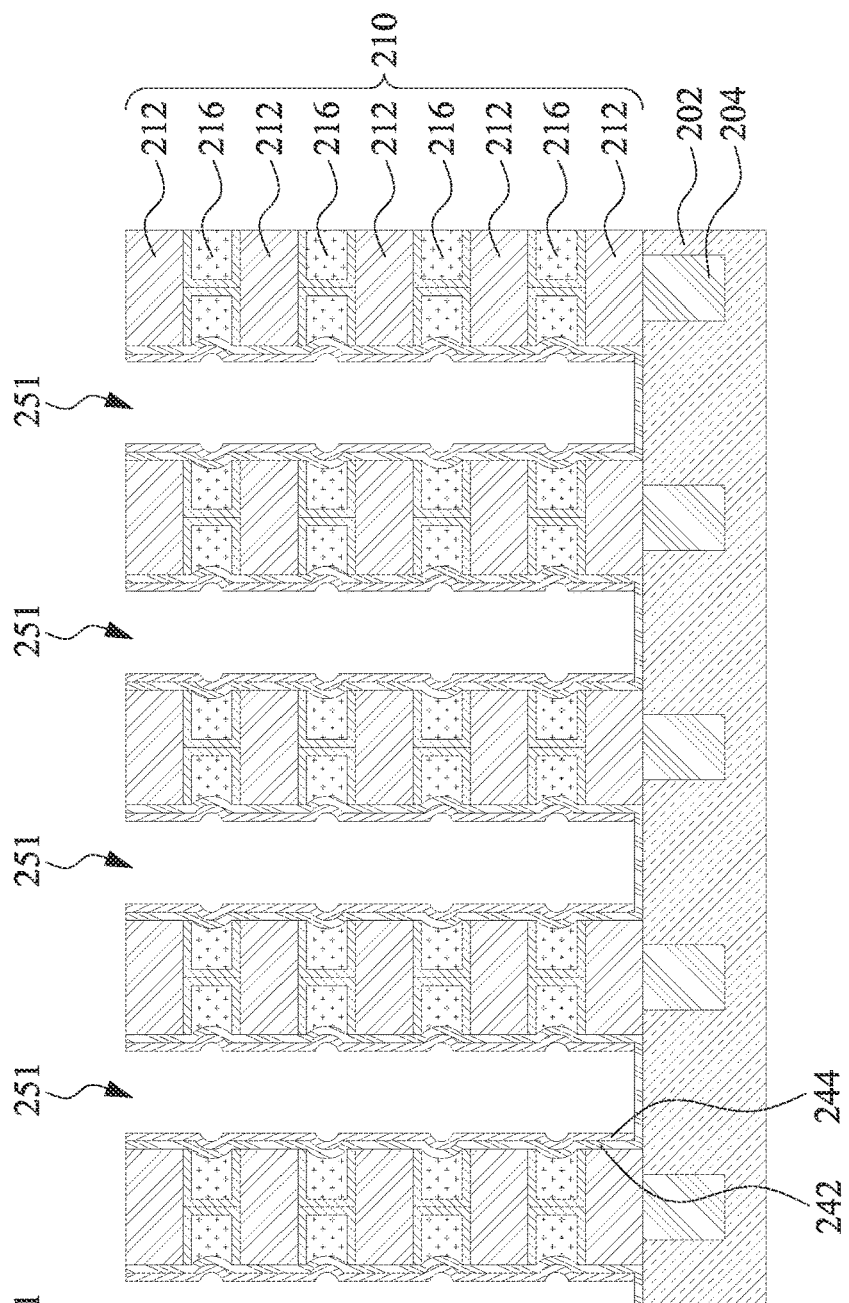

Referring to FIGS. 12A and 12B, in operation 107, the method 10 forms an isolation structure 252 in each trench 225 after the forming of the charge-trapping layer 242 and the channel layer 244. In some embodiments, the isolation structure 252 may be formed by filling each second trench 223 with a dielectric material, such as silicon oxide, silicon oxycarbide, silicon oxynitride, silicon carbonitride, and the like. The dielectric material may be used to fill up the trenches 225 and covers top surface of the stack 210 and dielectric structure 220. A planarization operation such as a CMP may be performed to remove superfluous dielectric material to form the isolations structure 252. Accordingly, a top surface of the isolation structure 252, the top surface of the dielectric structure 220, the top surface of the topmost first insulating layer 212, a topmost surface of the charge-trapping layer 242, and a topmost surface of the channel layer 244 may be aligned with each other.

Referring to FIGS. 13A, 13B, 14A and 14B, in operation 108, the method 10 forms a source structure 254S and a drain structure 254D at two sides of the isolation structure 252. In some embodiments, portions of the isolation structure 252 are removed. Accordingly, a plurality of recesses 251 are formed in the cell array region CA. In some embodiments, dimensions and depth of the recesses 251 are the same. Further, the channel layer 244 may be exposed through two opposite sidewalls of each recess 251, while the charge-trapping layer 242 may be exposed through a bottom of each recess 251. In the cell array region CA, the recesses 251 may be arranged to form a staggered pattern, but the disclosure is not limited thereto. In some embodiments, the recesses 251 are formed offset from the doped regions 204. Further, a width of each recess 251 is less than the distance between adjacent two doped regions 204.

Figure 14A:
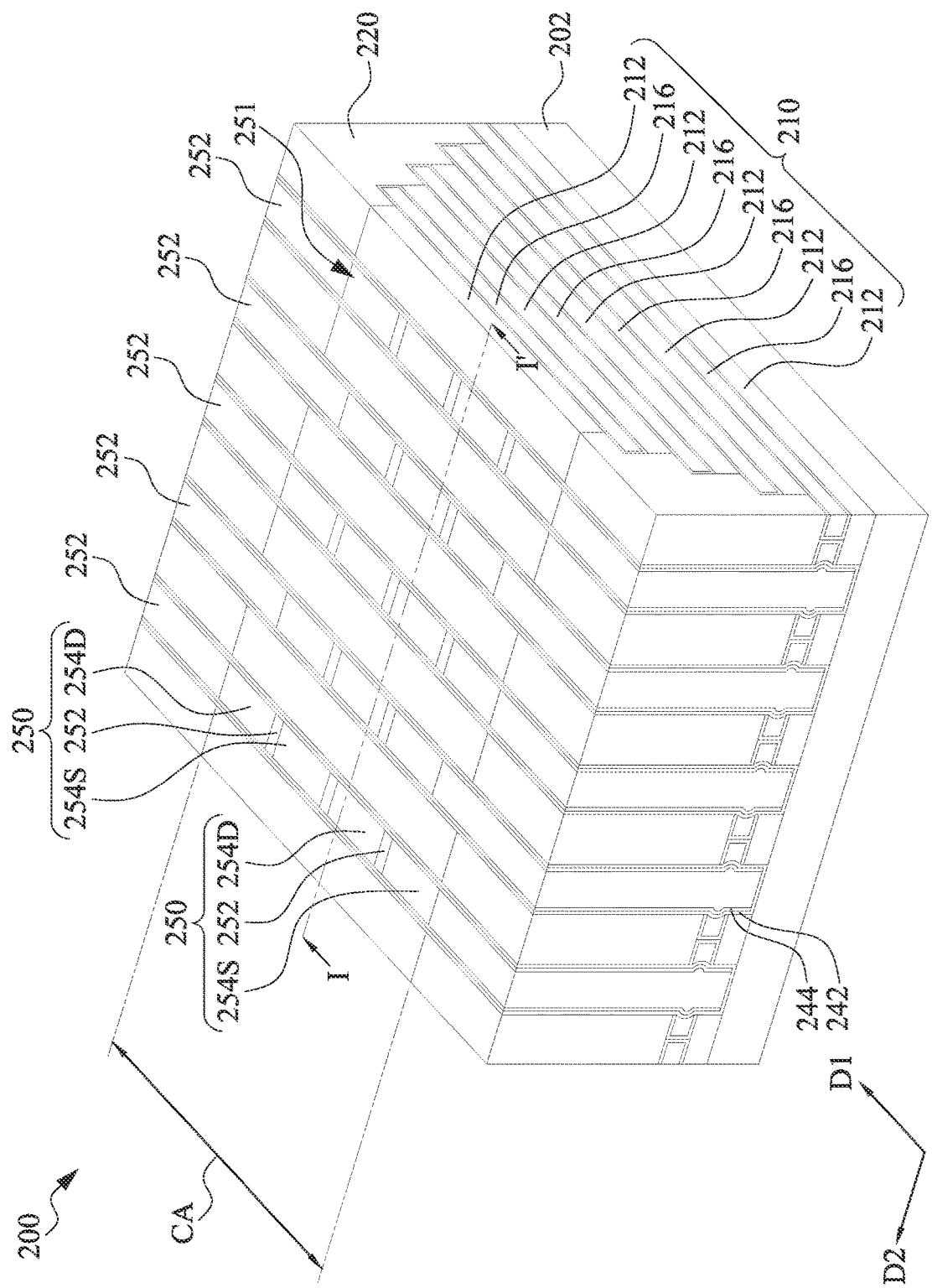
Figure 14B:
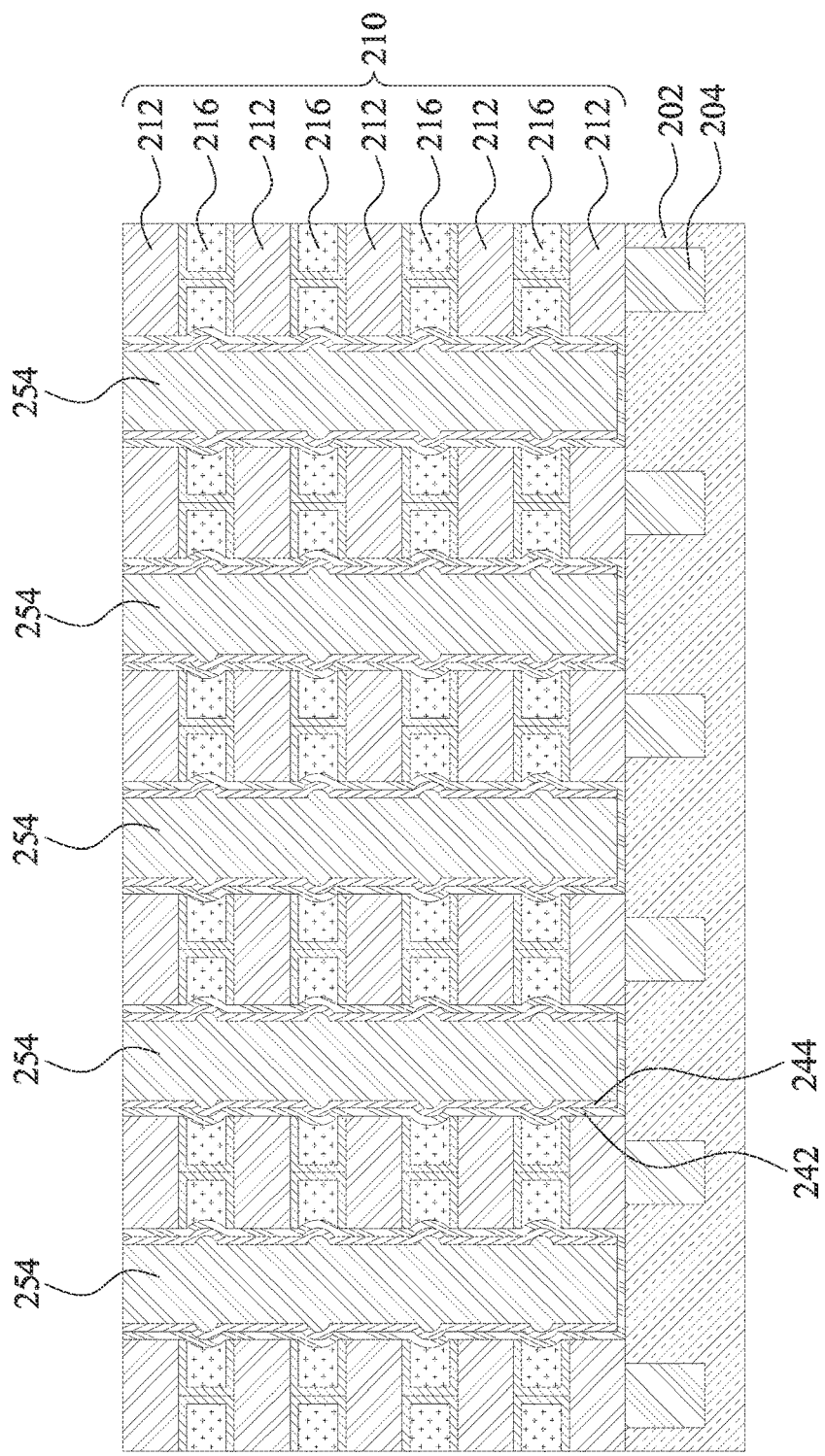

Referring to FIGS. 14A and 14B, the source structure 254S and the drain structure 254D are respectively formed in the recesses 251. In some embodiments, a barrier layer (not shown) can be formed to cover sidewalls and a bottom of each recess 251, and then the recesses 251 are filled with a conductive material. A planarization operation such as a CMP operation is performed to remove superfluous barrier layer and conductive material. Consequently, the source structure 254S and the drain structure 254D are formed at the two sides of the isolation structure 252. In some embodiments, the conductive material can include doped polysilicon, doped amorphous silicon, tungsten, copper, and the like. In some embodiments, a plurality of stacked memory cells Mc may be formed in the cell array region CA after the forming of the of source structure 254S and the drain structure 254D.

Still referring to FIGS. 14A and 14B, accordingly, a semiconductor memory structure 200 is obtained. The semiconductor memory structure 200 includes the substrate 202, the doped regions 204 in the substrate 202 and separated from each other by the substrate 202, and the plurality of conductive layers 216 and the first insulating layers 212 alternately stacked over the substrate 202. The semiconductor memory structure 200 further includes a plurality of columns 250 disposed over the substrate 202. As shown in FIGS. 14A and 14B, the columns 250 penetrate the stack 210 including the alternating conductive layers 216 and first insulating layers 212. Further, each of the columns 250 includes an isolation structure 252, a source structure 254S and a drain structure 254D. As shown in FIG. 14A, the source structure 254S and the drain structure 254D are disposed at two opposite sides of the isolation structure 252. The semiconductor memory structure 200 further includes a charge-trapping layer 242 disposed at two sides of each column 250, and a channel layer 244 between the charge trapping layer 242 and each column 250.

In some embodiments, the columns 250 are arranged to form an array pattern. In some embodiments, the columns 250 are arranged to form a staggered array pattern, as shown in FIG. 14A, but the disclosure is not limited thereto. Each of the columns 250 is offset from the doped regions 204. Further, a width of each column 250 is less than the distance between adjacent two doped regions 204. Further, as shown in FIG. 14B, the columns 250 are separated from the substrate 202 by the charge-trapping layer 242. Additionally, the channel layer 244 is also separated from the substrate 202 by the charge-trapping layer 242.

Figure 15:
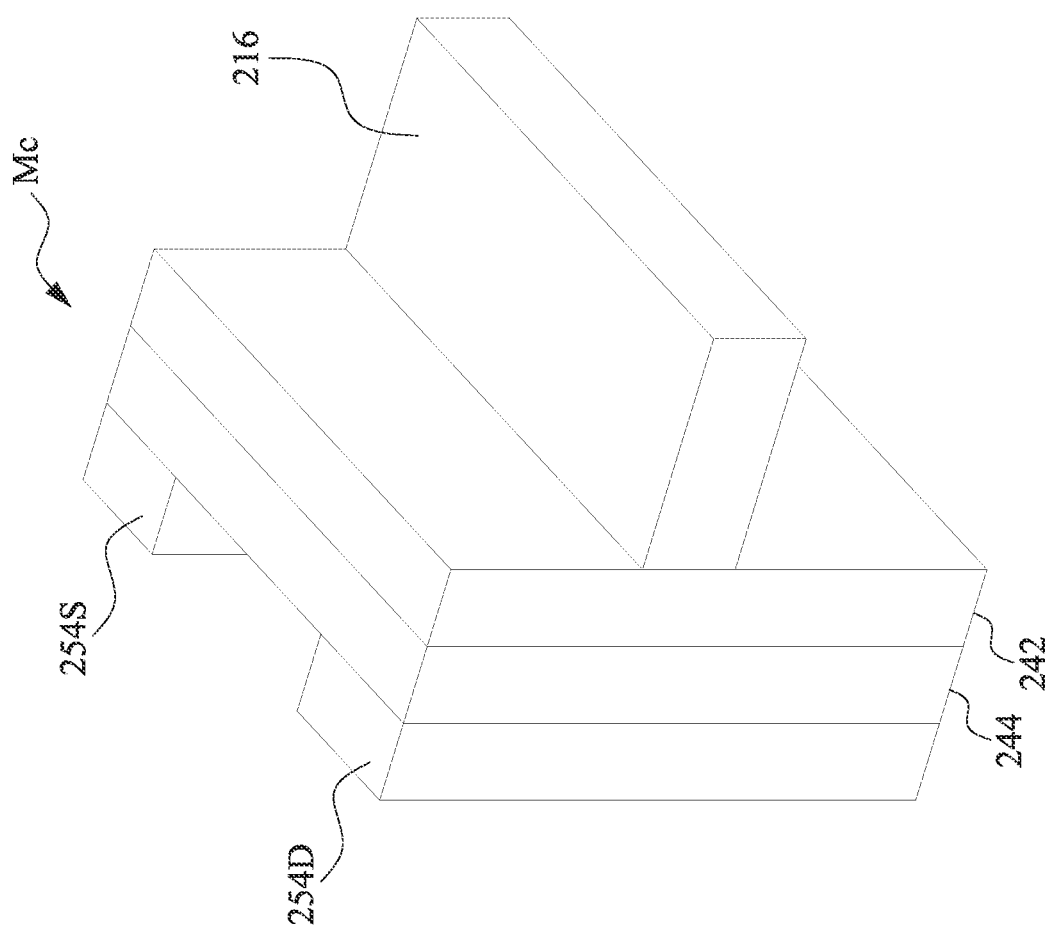
FIG. 15 is a schematic drawing illustrating a memory cell of the semiconductor memory structure.

Referring to FIG. 15, which is an enlarged view of a portion of the semiconductor memory structure 200, each of the columns 250 includes a plurality of memory cells Mc. Further, each of the memory cells Mc includes a conductive layer 216, a portion of the charge-trapping layer 242, a portion of the channel layer 244, a portion of the source structure 254S and a portion of the drain structure 254D.

As mentioned above, the doped regions 204 include dopants of the second conductivity type, which is complementary to the dopants of the first conductivity type in the substrate 202, therefore, an NPN junction or a PNP junction may be formed by the doped regions 204 and the substrate 202. In some embodiments, an $N^+PN^+$ junction or a $P^+NP^+$ junction may be formed by the doped regions 204 and the substrate 202.

Figure 16:
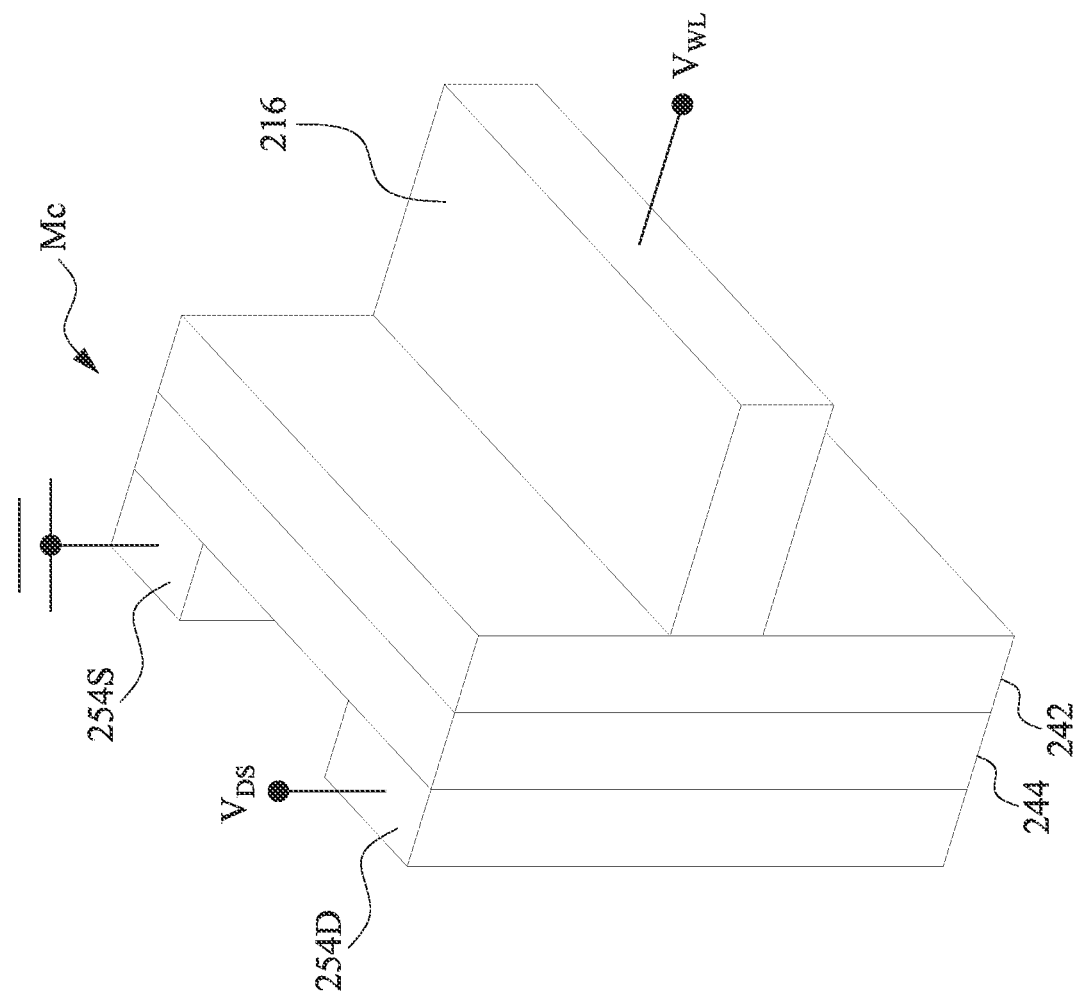
FIGS. 16 and 17 are schematic drawings illustrating the memory cell in different operation states, respectively.
Figure 17:
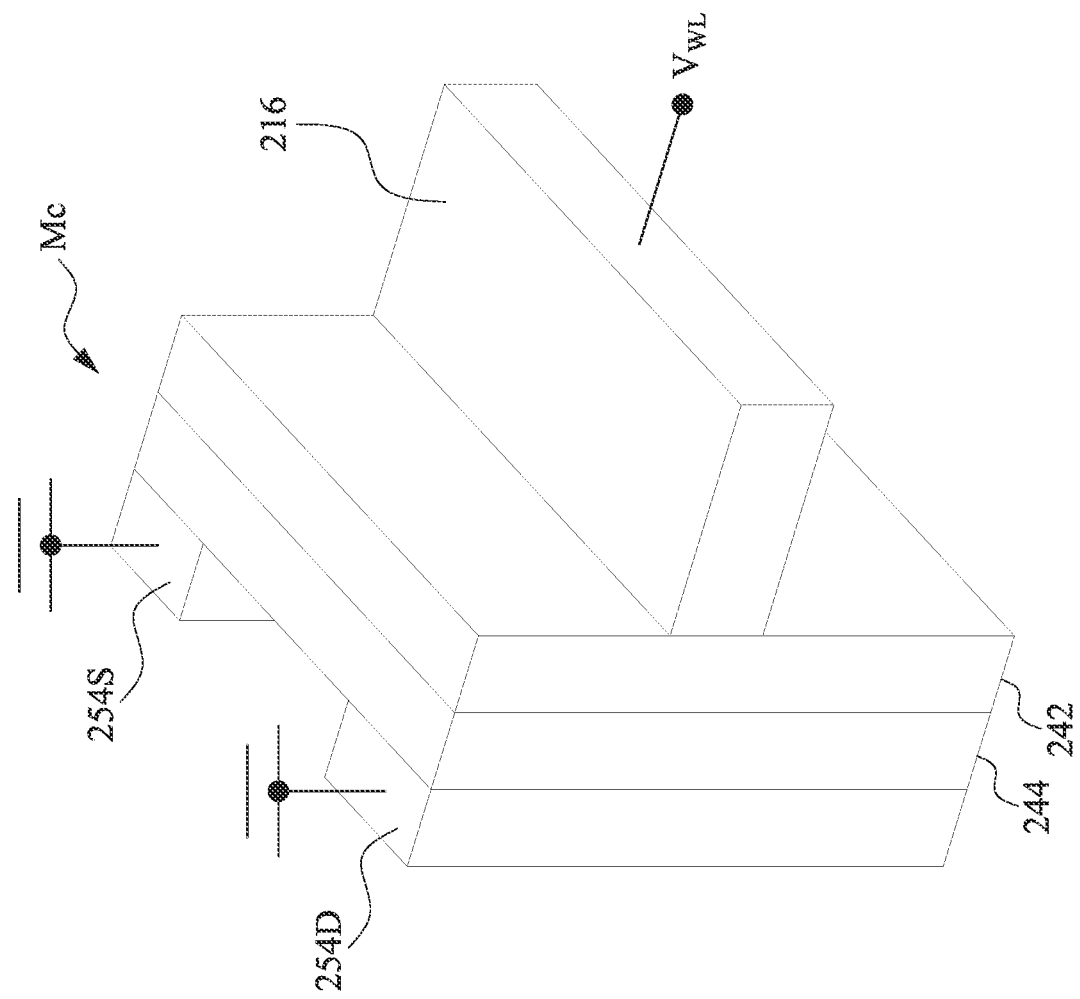

Referring to FIGS. 16 and 17, which are schematic drawings illustrating the memory cell Mc in the programming operation and the erasing operation, respectively. Referring to FIG. 16, during the programming operation, positive voltage is applied to the conductive layer 216 (i.e., $V_{WL}>0$), electrons are accumulated in the channel layer 244, and the memory cell Mc is in On state. Referring to FIG. 17, during the erasing operation, negative voltage is applied to the conductive layer 216 (i.e., $V_{WL}<0$), electrons are depleted, and the memory cell Mc is in Off state. In some embodiments, when the doped regions 204 and the substrate 202 form the NPN or N+PN+ junction, the NPN junction or the N+PN+ junction helps to inject the carriers, such as holes into the channel layer 244. Further, an inversion layer may be formed in the channel layer 244 due to the carrier injection. In some embodiments, the inversion layer helps to screen electric field toward the channel layer 242. Therefore, the electric fields generated to flip dipoles can be concentrated in the ferroelectric layer 242. Thus, at least the erasing operation efficiency can be improved. Additionally, when the doped regions 204 and the substrate 202 form PNP junction, the PNP junction helps to inject charge carriers, such as electrons into the channel layer 244.

Accordingly, the present disclosure provides a semiconductor memory structure and a method for forming the same that is able to improve erasing operation efficiency and thus mitigate the small MW issue. In some embodiments, the doped regions are formed in the substrate on which the 3D memory array is stacked. Accordingly, NPN junctions or PNP junctions are formed by the substrate and the doped region. The NPN junctions or PNP junctions are able to provide carriers. As mentioned above, the carriers are injected into the channel layer, thereby an inversion layer that is able to help to screen electric field toward the channel layer may be formed. Accordingly, the electric fields generated to flip dipoles can be concentrated in the ferroelectric layer. Thus erasing and programming operation efficiency can be improved, and the small MW issue can be mitigated.

In some embodiments, a semiconductor memory structure is provided. The semiconductor memory structure includes a substrate, two doped regions in the substrate, a plurality of gate layers, a plurality of insulating layers, a column disposed over the substrate, a charge-trapping layer, and a channel layer. The substrate includes dopants of a first conductivity type, and the two doped regions include dopants of a second conductivity type complementary to the first conductivity type. The gate layers and the insulating layers are alternately stacked over the substrate. The column penetrates the gate layers and the insulating layers. The column includes an isolation structure, a source structure and a drain structure. The source structure and the drain structure are disposed at two sides of the isolation structure. The charge-trapping layer is at two sides of the column, and the channel layer is between the charge-trapping layer and the column. In some embodiments, a bottom surface of the charge-trapping layer is in contact with the substrate and separated from the two doped regions.

In some embodiments, a semiconductor memory structure is provided. The semiconductor memory structure includes a substrate, a plurality of doped regions, a plurality of gate layers, a plurality of insulating layers, a plurality of columns, a charge-trapping layer, and a channel layer. The substrate includes dopants of a first conductivity type, and each of the doped regions includes dopants of a second conductivity complementary to the first conductivity type. The doped regions are disposed in the substrate and separated from each other. The gate layers and the insulating layers are alternately stacked over the substrate. The columns are disposed over the substrate and penetrate the gate layers and the insulating layers. Each of the columns includes an isolation structure, a source structure, and a drain structure. The source structure and the drain structure are disposed at two sides of the isolation structure. The charge-trapping layer is at two sides of each column. The channel layer is between the charge-trapping layer and each column. The substrate and the doped regions form a plurality of NPN junctions or a plurality of PNP junctions. The NPN junctions or the PNP junctions provide charge carriers to the channel layer.

In some embodiments, a method for forming a semiconductor memory structure is provided. The method includes following operations. A plurality of doped regions are formed in a semiconductor substrate. The doped regions are separated from each other. A stack including a plurality of first insulating layers and a plurality of second insulating layers alternately arranged is formed over the semiconductor substrate. A first trench is formed in the stack. The second insulating layers are replaced with a plurality of conductive layers. A second trench is formed. A charge-trapping layer and a channel layer are formed in the second trench. An isolation structure is formed to fill the second trench. A source structure and a drain structure are formed at two sides of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure, comprising:
   a substrate comprising dopants of a first conductivity type;
   two doped regions in the substrate and respectively comprising dopants of a second conductivity type complementary to the first conductivity type;
   a plurality of gate layers and a plurality of insulating layers alternately stacked over the substrate; and
   a column disposed over the substrate and penetrating the plurality of gate layers and the plurality of insulating layers, wherein the column comprises an isolation structure, a source structure and a drain structure, and the source structure and the drain structure are disposed at two sides of the isolation structure;
   a charge-trapping layer at two sides of the column; and
   a channel layer between the charge-trapping layer and the column,
   wherein a bottom surface of the charge-trapping layer is in contact with the substrate and separated from the two doped regions, and wherein the channel layer is separated from the substrate by the charge-trapping layer.

2. The semiconductor memory structure of claim 1, wherein the substrate and the two doped regions form an NPN junction or a PNP junction.

3. The semiconductor memory structure of claim 2, wherein the NPN junction or the PNP junction provide charge carriers to the channel layer.

4. The semiconductor memory structure of claim 1, wherein a concentration of the dopants of the second conductivity type in each of the two doped regions is greater than a concentration of the dopants of the first conductivity type in the substrate.

5. The semiconductor memory structure of claim 4, wherein the concentration of the dopants of the first conductivity type in the substrate is between $1E15$ ions/cm$^3$ and $1E17$ ions/cm$^3$.

6. The semiconductor memory structure of claim 4, wherein the concentration of the dopants of the second conductivity type in each of the two doped regions is between $1E18$ ions/cm$^3$ and approximately $1E20$ ions/cm$^3$.

7. The semiconductor memory structure of claim 1, wherein the charge-trapping layer comprises ferroelectric material.

8. The semiconductor memory structure of claim 1, wherein the channel layer comprises semiconductor material.

9. A semiconductor memory structure, comprising:
a substrate comprising dopants of a first conductivity type;
a plurality of doped regions in the substrate and separated from each other, wherein each doped region comprises dopants of a second conductivity type complementary to the first conductivity type;
a plurality of gate layers and a plurality of insulating layers alternately stacked over the substrate;
a plurality of columns disposed over the substrate and penetrating the plurality of gate layers and the plurality of insulating layers, wherein each column comprises an isolation structure, a source structure and a drain structure, and the source structure and the drain structure are disposed at two sides of the isolation structure;
a charge-trapping layer at two sides of each column; and
a channel layer between the charge-trapping layer and each column;
wherein the substrate and the plurality of doped regions form a plurality of NPN junctions or a plurality of PNP junctions, and the plurality of NPN junctions or the plurality of PNP junctions provide charge carriers to the channel layer, and wherein the charge-trapping layer is between the channel layer and the substrate.

10. The semiconductor memory structure of claim 9, wherein a bottom surface of the charge-trapping layer is in contact with the substrate and separated from the plurality of doped regions.

11. The semiconductor memory structure of claim 9, wherein the plurality of NPN junctions inject holes into the channel layer.

12. The semiconductor memory structure of claim 9, wherein a concentration of the dopants of the second conductivity type in each doped region is greater than a concentration of the dopants of the first conductivity type in the substrate.

13. The semiconductor memory structure of claim 9, wherein the charge-trapping layer comprises ferroelectric material.

14. The semiconductor memory structure of claim 9, wherein the channel layer comprises semiconductor material.

15. The semiconductor memory structure of claim 9, wherein a distance between two adjacent of the plurality of doped regions is greater than a width of each column.

16. The semiconductor memory structure of claim 9, wherein a bottom of each doped region is in contact with the substrate.

17. A semiconductor memory structure, comprising:
a substrate;
two doped regions in the substrate, wherein a bottom of each doped region is in contact with the substrate;
a plurality of gate layers and a plurality of insulating layers alternately stacked over the substrate;
an isolation structure disposed over the substrate and penetrating the plurality of gate layers and the plurality of insulating layers;
a source structure and a drain structure disposed over the substrate and penetrating the plurality of gate layers and the plurality of insulating layers, wherein the source structure and the drain structure are disposed at two sides of the isolation structure;
a charge-trapping layer between the source structure and the plurality of gate layers, and between the drain structure and the plurality of gate layers; and
a channel layer between the charge-trapping layer and source structure, and between the charge-trapping layer and the drain structure, wherein the channel layer is separated from the substrate by the charge-trapping layer.

18. The semiconductor memory structure of claim 17, wherein the substrate and the two doped regions form an NPN junction or a PNP junction.

19. The semiconductor memory structure of claim 17, wherein a bottom surface of the charge-trapping layer is in contact with the substrate and separated from each of the two doped regions.

20. The semiconductor memory structure of claim 17, wherein a distance between the two doped regions is greater than a width of the isolation structure.

* * * * *